US012654979B2

(12) United States Patent
Lee et al.

(10) Patent No.: US 12,654,979 B2
(45) Date of Patent: Jun. 16, 2026

(54) SEMICONDUCTOR DEVICE AND METHOD OF FORMING THE SAME

(71) Applicant: Taiwan Semiconductor Manufacturing Company, Ltd., Hsinchu (TW)

(72) Inventors: Hengyuan Lee, Hsinchu County (TW); Xinyu Bao, Fremont, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 799 days.

(21) Appl. No.: 18/166,479

(22) Filed: Feb. 9, 2023

(65) Prior Publication Data

US 2024/0179923 A1     May 30, 2024

Related U.S. Application Data

(60) Provisional application No. 63/428,422, filed on Nov. 29, 2022.

(51) Int. Cl.
*B65H 54/58*     (2006.01)
*H10B 63/00*     (2023.01)
*H10N 70/00*     (2023.01)
*H10W 20/41*     (2026.01)

(52) U.S. Cl.
CPC ........... *B65H 54/585* (2013.01); *H10B 63/84* (2023.02); *H10N 70/011* (2023.02); *H10N 70/826* (2023.02); *H10W 20/435* (2026.01)

(58) Field of Classification Search
CPC ..... B65H 54/585; H10B 63/84; H10N 70/011
See application file for complete search history.

(56) References Cited

U.S. PATENT DOCUMENTS

2023/0354722 A1* 11/2023 Wu ....................... H10N 70/841
2024/0040804 A1*  2/2024 Ino .......................... H10B 63/10

* cited by examiner

*Primary Examiner* — Marvin Payen
(74) *Attorney, Agent, or Firm* — JCIPRNET

(57) ABSTRACT

A semiconductor device includes a first conductive layer, a memory layer, a second conductive layer and a selector layer. The memory layer surrounds the first conductive layer. The second conductive layer is disposed aside the memory layer. The selector layer is disposed on the second conductive layer. A first side of the second conductive layer is covered by the memory layer, a second side of the second conductive layer is covered by the selector layer, and a third side of the second conductive layer is exposed by the selector layer.

20 Claims, 31 Drawing Sheets

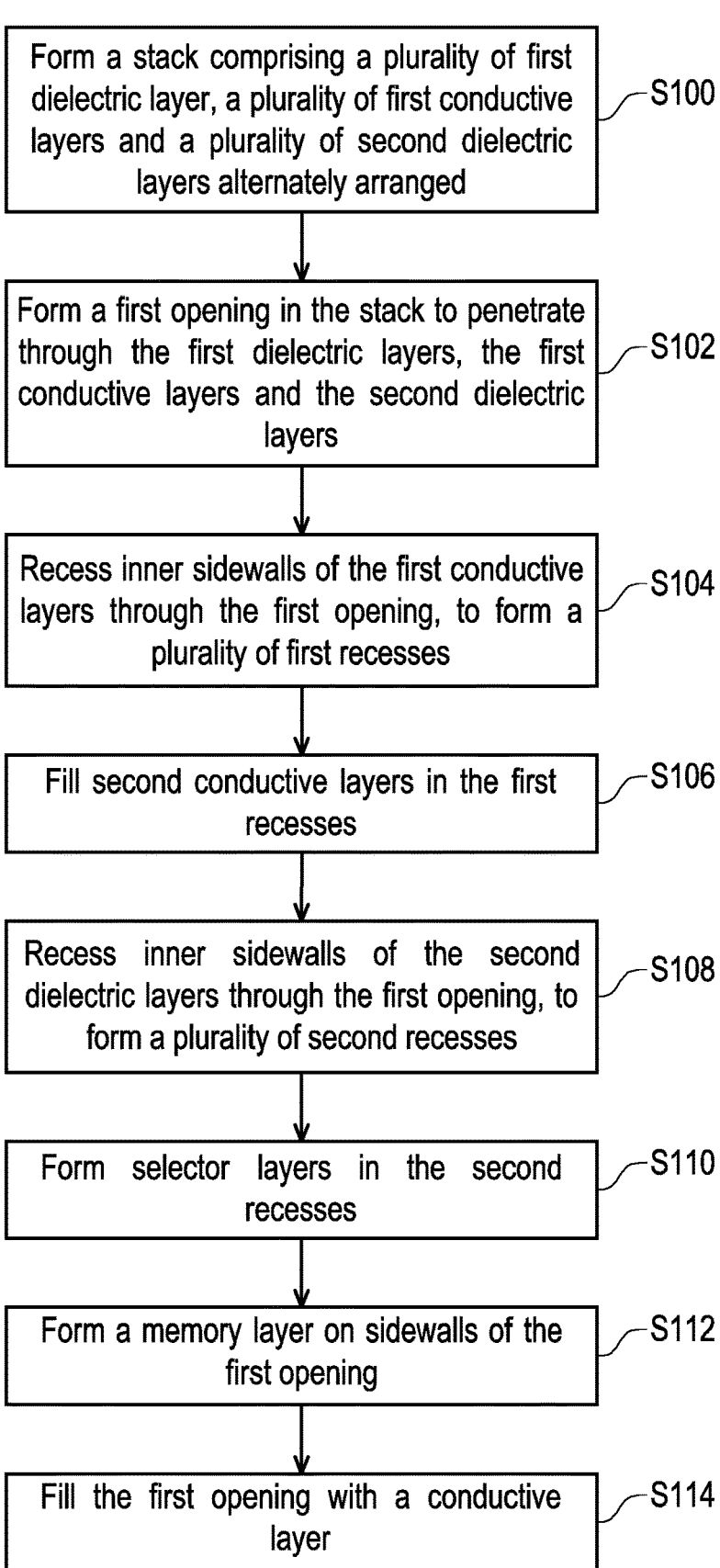

Form a stack comprising a plurality of first dielectric layer, a plurality of first conductive layers and a plurality of second dielectric layers alternately arranged —S100

Form a first opening in the stack to penetrate through the first dielectric layers, the first conductive layers and the second dielectric layers —S102

Recess inner sidewalls of the first conductive layers through the first opening, to form a plurality of first recesses —S104

Fill second conductive layers in the first recesses —S106

Recess inner sidewalls of the second dielectric layers through the first opening, to form a plurality of second recesses —S108

Form selector layers in the second recesses —S110

Form a memory layer on sidewalls of the first opening —S112

Fill the first opening with a conductive layer —S114

FIG. 8

SEMICONDUCTOR DEVICE AND METHOD OF FORMING THE SAME

CROSS-REFERENCE TO RELATED APPLICATION

This application claims the priority benefits of U.S. provisional application Ser. No. 63/428,422, filed on Nov. 29, 2022. The entirety of the above-mentioned patent application is hereby incorporated by reference herein.

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 illustrates a method of forming a semiconductor device in accordance with some embodiments of the present disclosure.

DETAILED DESCRIPTION

Figure 1:
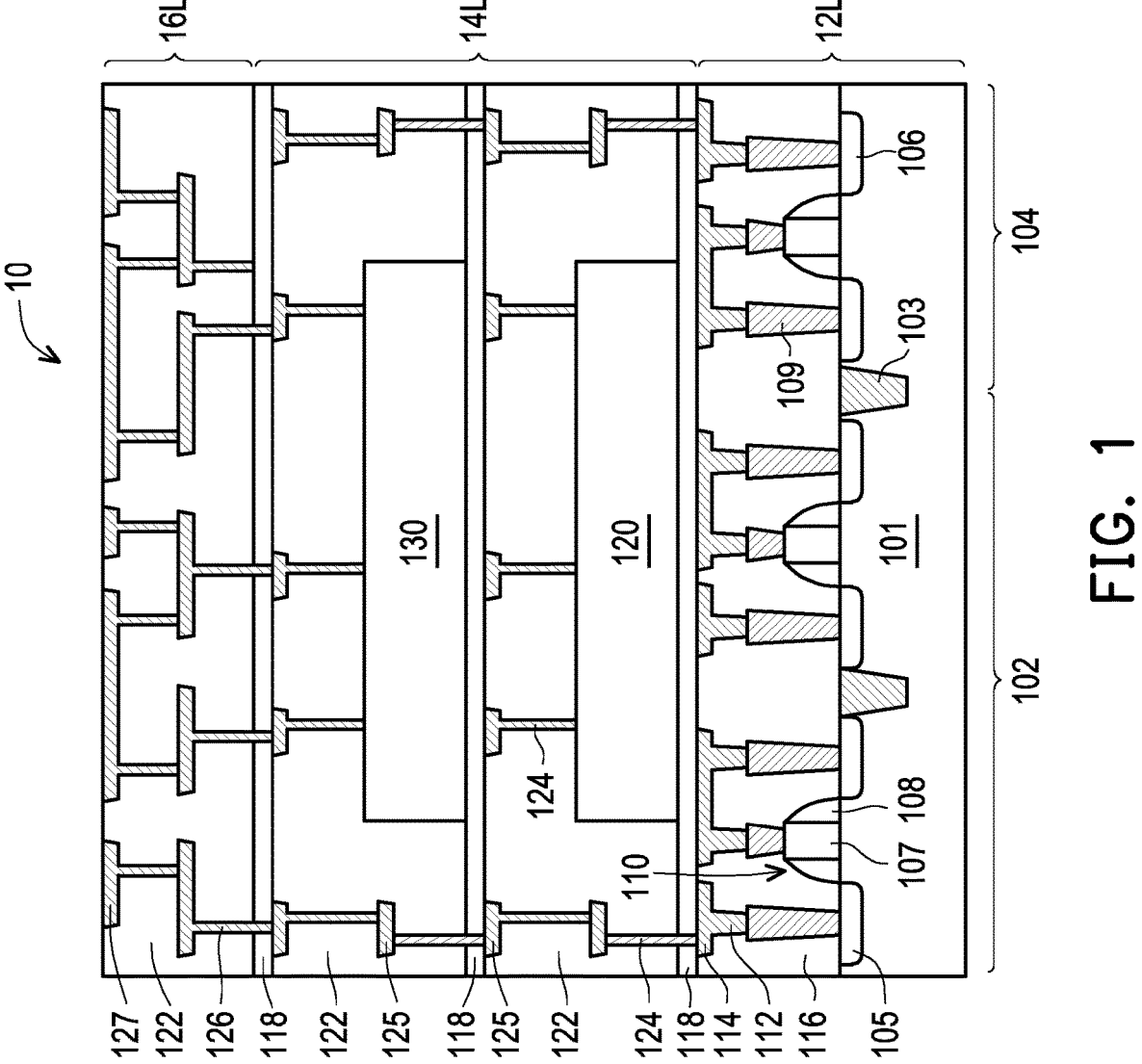
FIG. 1 illustrates a cross-sectional view of a semiconductor device 10 in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of a semiconductor device 10 in accordance with some embodiments. In some embodiments, the semiconductor device 10 is formed with integrated memory devices 120 and 130. The semiconductor device 10 may include active devices 110 and memory devices 120, 130. The active devices 110 may be field effect transistor (FET) devices. In one embodiment, the active devices 110 are formed through the front-end-of-line (FEOL) manufacturing processes and include fin field effect transistors (FinFETs). The at least one of the memory devices 120, 130 may include ferroelectric random access memory (FeRAM) devices formed through the back-end-of-line (BEOL) manufacturing processes. It is understood that FinFETs are used as examples, and other kinds of FEOL devices such as planar transistors or gate-all-around (GAA) transistors may be used herein and included within the scope of the present disclosure. That is, the memory devices 120, 130 may be integrated with or in any suitable semiconductor devices. In FIG. 1, the details of the memory devices 120, 130 are not shown and further details will be described later in subsequent figures.

As illustrated in FIG. 1, the semiconductor device 10 includes different regions for forming different types of circuits. For example, the semiconductor device 10 includes a first region 102 for forming logic circuits and a second region 104 for forming peripheral circuits, input/output (I/O) circuits, electrostatic discharge (ESD) circuits, and/or analog circuits. The semiconductor device 10 may also include other regions for forming other types of circuits which are fully intended to be included within the scope of the present disclosure. The semiconductor device 10 includes a substrate 101. In some embodiments, the substrate 101 is a bulk substrate, such as a silicon substrate, doped or undoped, or an active layer of a semiconductor-on-insulator (SOI) substrate. In some embodiments, the substrate 101 includes other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. For example, additional electrical components, such as resistors, capacitors, inductors, diodes, or the like, is formed in or on the substrate 101 during the FEOL manufacturing processes.

As seen in FIG. 1, the active devices 110 are formed on the substrate 101, and isolation regions 103, such as shallow trench isolation (STI) regions, are formed between or around the active devices 110. In some embodiments, the active device 110 includes a gate electrode 107 and source and drain regions 105 and 106. The gate electrode 107 may be formed over the substrate 101 with gate spacers 108 along sidewalls of the gate electrode 107. The source and drain regions 105 and 106 such as doped or epitaxial source and drain regions are formed on opposing sides of the gate electrode 107. In some embodiments, conductive contacts 109, such as gate contacts and source/drain contacts, are formed over and electrically coupled to respective underlying electrically conductive features (e.g., gate electrodes 107 or source and drain regions 105 and 106). In some embodiments, a dielectric layer 116, such as an inter-layer dielectric (ILD) layer, is formed over the substrate 101 and covering the source and drain regions 105 and 106, the gate electrode 107 and the contacts 109, and other electrically conductive features, such as conductive interconnect structures including conductive vias 112 and conductive lines 114, are embedded in the dielectric layer 116. It is understood that the dielectric layer 116 may include more than one dielectric layers of the same or different dielectric materials. Collectively, the substrate 101, the active devices 110, the contacts 109, conductive features 112/114, and the dielectric layers 116 shown in FIG. 1 may be referred to as the front-end level 12L.

Referring to FIG. 1, dielectric layers 118 and dielectric layers 122 are formed over the dielectric layer 116 in alternation. In one embodiment, at least one of the dielectric layers 118 includes an etch stop layer (ESL). In some embodiments, the materials of the dielectric layers 118 is different from the materials of the dielectric layers 116 and 122. In some embodiments, the material of the dielectric layer(s) 118 includes silicon nitride or carbide formed by plasma-enhanced physical vapor deposition (PECVD). In some embodiments, one or more of the dielectric layers 118 is omitted. In some embodiments, the dielectric layers 116 and 122 is formed of any suitable dielectric material, such as silicon oxide, silicon nitride, silicon oxynitride, phosphosilicate glass (PSG), borosilicate glass (BSG), boron-doped phosphosilicate glass (BPSG), or low-k materials, formed by a suitable method, such as spin coating, physical vapor deposition (PVD), chemical vapor deposition (CVD), or the like. In FIG. 1, memory devices 120 and 130, each of which may include a plurality of memory cells, are formed in the dielectric layer 122 and coupled to electrically conductive features (e.g., conductive vias 124 and conductive lines 125) in the dielectric layer 122.

In FIG. 1, the memory devices 120 and 130 are formed at different layers of the dielectric layers 122. The memory device 120 is formed at the lower layer, and the memory device 130 is formed at the upper layer. In some embodiments, the memory devices 120 and 130 have the same or similar structure. In some embodiments, the memory devices 120 and 130 have different structure designs.

Although two layers of memory devices are depicted in FIG. 1, other numbers of layers of memory devices, such as one layer, three layers, or more, are also possible and are encompassed within the scope of the present disclosure. Collectively, the layers of memory device 120 and 130 are referred to as the memory device level 14L or a memory region of the semiconductor device 10. The memory device level 14L may be formed in the BEOL processes of semiconductor manufacturing. The memory devices 120 and 130 may be formed in the BEOL processes at any suitable locations within the semiconductor device 10, such as over the first region 102, over the second region 104, or over a plurality of regions.

After the memory device level 14L is formed, an interconnect level 16L including electrically conductive interconnecting features (e.g., conductive vias 126 and conductive lines 127) embedded in the dielectric layer(s) 122 is formed over the memory device level 14L. Any suitable methods may be employed to form the interconnect level 16L, and the details are not described herein. In some embodiments, the interconnect level 16L is electrically connect the electrical components formed in/on the substrate 101 to form functional circuits. In some embodiments, the interconnect structure 16L is also electrically coupled to memory devices 120, 130 to the active devices 110 and/or the components in/on the substrate 101. In addition, the memory devices 120 and 130 may be electrically coupled to an external circuit or an external device through the structure of the interconnect level 16L. In some embodiments, the memory devices 120 and 130 are electrically coupled to the active devices 110 of the front-end level 12L and/or other electrical components formed in the substrate 101, and are controlled or accessed (e.g., written to or read from) by functional circuits of the semiconductor device 10. Alternatively, the memory devices 120, 130 are electrically coupled to (e.g., controlled or accessed) an external circuit of another semiconductor device through the structure of the interconnect level 16L.

FIG. 2A to FIG. 2G are cross-sectional views illustrating various stages of a manufacturing method of a memory device. According to some embodiments, the memory device may be a three-dimensional (3D) memory device with a resistive material. The memory devices depicted in the following paragraphs may be used as the memory devices 120 and 130 in FIG. 1.

Figure 2A:
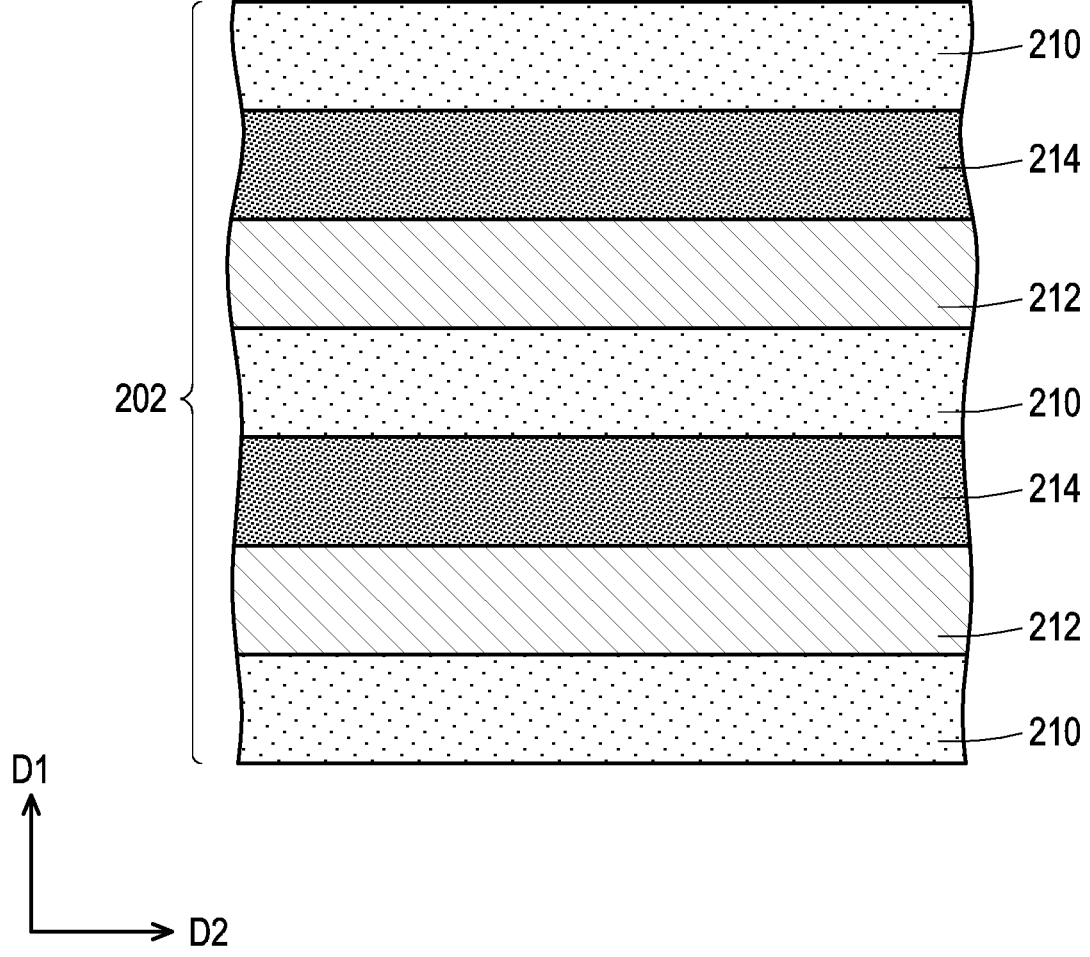
FIG. 2A to FIG. 2G are cross-sectional views illustrating various stages of a manufacturing method of a memory device.

Referring to FIG. 2A, a multi-layer stack 202 is formed. In some embodiments, the multi-layer stack 202 includes a plurality of first dielectric layers 210, a plurality of conductive layers 212 and a plurality of second dielectric layers 214. The first dielectric layers 210, the conductive layers 212 and the second dielectric layers 214 are alternately stacked on one another. For example, the conductive layer 212 is sandwiched between the first dielectric layer 210 and the second dielectric layer 214. In some embodiments, the first dielectric layers 210, the conductive layers 212 and the second dielectric layers 214 are alternately stacked in a first direction D1 (e.g., Z direction), and then another first dielectric layer 210 is formed thereon as the topmost layer. The first direction D1 is a vertical direction, for example. In some embodiments, the first dielectric layers 210 and the second dielectric layers 214 are also referred to as ILD layers. The conductive layer 212 may be also referred to as conductive lines.

The first dielectric layer 210 and the second dielectric layer 214 have different materials. In some embodiments, materials of the first dielectric layer 210 and the second dielectric layer 214 are not particularly limited, as long as said materials renders good etching selectivity between the first dielectric layer 210 and the second dielectric layer 214. For example, the etching selectivity between the first dielectric layer 210 and the second dielectric layer 214 ranges between 1:10 and 1:10000. Herein, the etching selectivity is denoted by a ratio between an etch rate of the first dielectric layer 210 and the second dielectric layer 214.

In some embodiments, the first dielectric layer 210 and the second dielectric layer 214 are formed of any suitable dielectric material, such as silicon oxide, silicon nitride, silicon oxynitride, phosphosilicate glass (PSG), borosilicate glass (BSG), boron-doped phosphosilicate glass (BPSG), or low-k materials, formed by a suitable method, such as spin coating, physical vapor deposition (PVD), chemical vapor deposition (CVD), or the like. In some embodiments, the first dielectric layers 210 are silicon oxide (SiO) layers and the second dielectric layers 214 are silicon nitride (SiN) layers. In some embodiments, the first dielectric layers 210 and the second dielectric layers 214 are respectively made of a single layer having one of the foregoing materials. However, the disclosure is not limited thereto. In some alternative embodiments, the first dielectric layers 210 and the second dielectric layers 214 may be made of a laminate structure of at least two of the foregoing materials.

In some embodiments, the conductive layer 212 includes TiN, TaN, W, Ru, Al, the like or a combination thereof. In some embodiments, the conductive layer 212 is made by a single material such as TiN. In some embodiments, the conductive layer 212 is a multi-layer structure. For example (not shown), the conductive layer 212 includes two barrier layers and a metal layer between the barrier layers. Specifically, a barrier layer is disposed between the metal layer and the adjacent first dielectric layer 210 and second dielectric layer 214. The barrier layers may prevent the metal layer from diffusion to the adjacent first dielectric layer 210 and second dielectric layer 214. The barrier layers may also provide the function of increasing the adhesion between the metal layer and the adjacent dielectric layers, and may be referred to as glue layers in some examples. In some embodiments, both barrier layers and glue layers with different materials are provided as needed. The barrier layers are formed of a first conductive material, such as a metal nitride, such as titanium nitride, tantalum nitride, molybdenum nitride, zirconium nitride, hafnium nitride, or the like. The metal layer may be formed of a second conductive material, such as a metal, such as tungsten, ruthenium, molybdenum, cobalt, aluminum, nickel, copper, silver, gold, alloys thereof, or the like. The barrier layers and metal layer may each be formed by an acceptable deposition process such as CVD, PVD, ALD, PECVD, or the like.

Figure 2B:
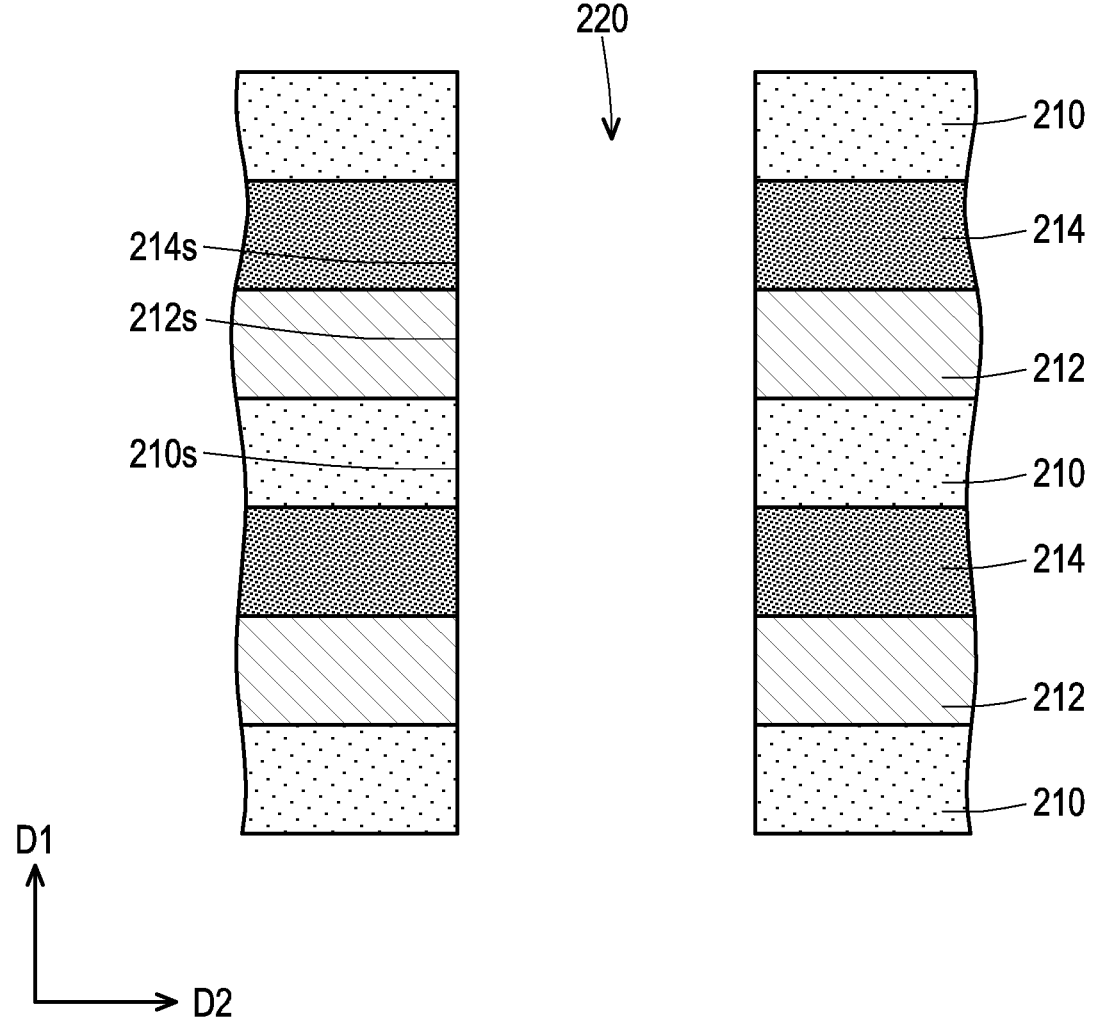

Referring to FIG. 2B, an opening 220 is formed in the multi-layer stack 202. In some embodiments, a photoresist pattern is formed on the multi-layer stack 202, and then an etching process is performed to remove a portion of the multi-layer stack 202 by using the photoresist pattern as an etching mask, so as to form the opening 220. In some embodiments, the etching process includes a dry etching process, such as a reactive ion etching (RIE) process. In the case, as shown in FIG. 2B, the opening 220 penetrates through the multi-layer stack 202 and exposes an underlaying layer (not shown). The underlaying layer and the multi-layer stack 202 have etching selectivity. That is, the multi-layer stack 202 has an etching rate greater than an etching rate of the underlaying layer during the etching process. Accordingly, no or only a few of the underlaying layer is removed while most of the multi-layer stack 202 are removed. Further, in some embodiments, after forming the opening 220, inner sidewalls 210s of the first dielectric layers 210, inner sidewalls 212s of the conductive layers 212 and inner sidewalls 214s of the second dielectric layers 214 are substantially aligned with one another.

Figure 2C:
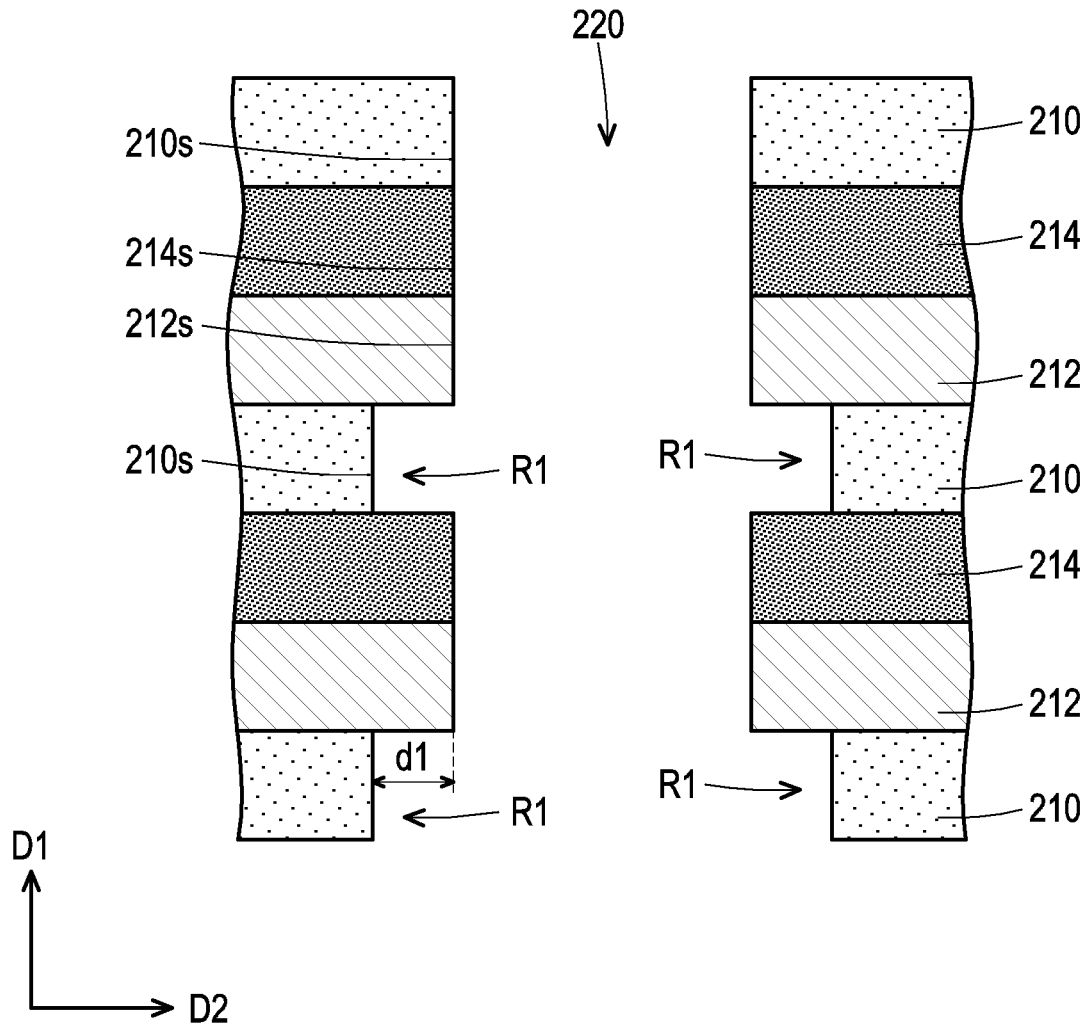

Referring to FIG. 2C, the first dielectric layers 210 are laterally recessed through the opening 220 by using an etching process. In some embodiments, portions of the first dielectric layers 210 exposed by the opening 220 are removed, and thus as shown in FIG. 2C, a plurality of recesses R1 are respectively formed between adjacent two of the second dielectric layers 214 and the conductive layers 212. The recess R1 exposes the underlying layer such as the second dielectric layer 214. In some embodiments, the recess R1 has a dimension d1 along a second direction D2 (e.g., X direction). The second direction D2 is substantially perpendicular to the first direction D1. The second direction D2 is a horizontal direction, for example. In some embodiments, the etching process includes a wet etching process by using a suitable etchant.

Figure 2D:
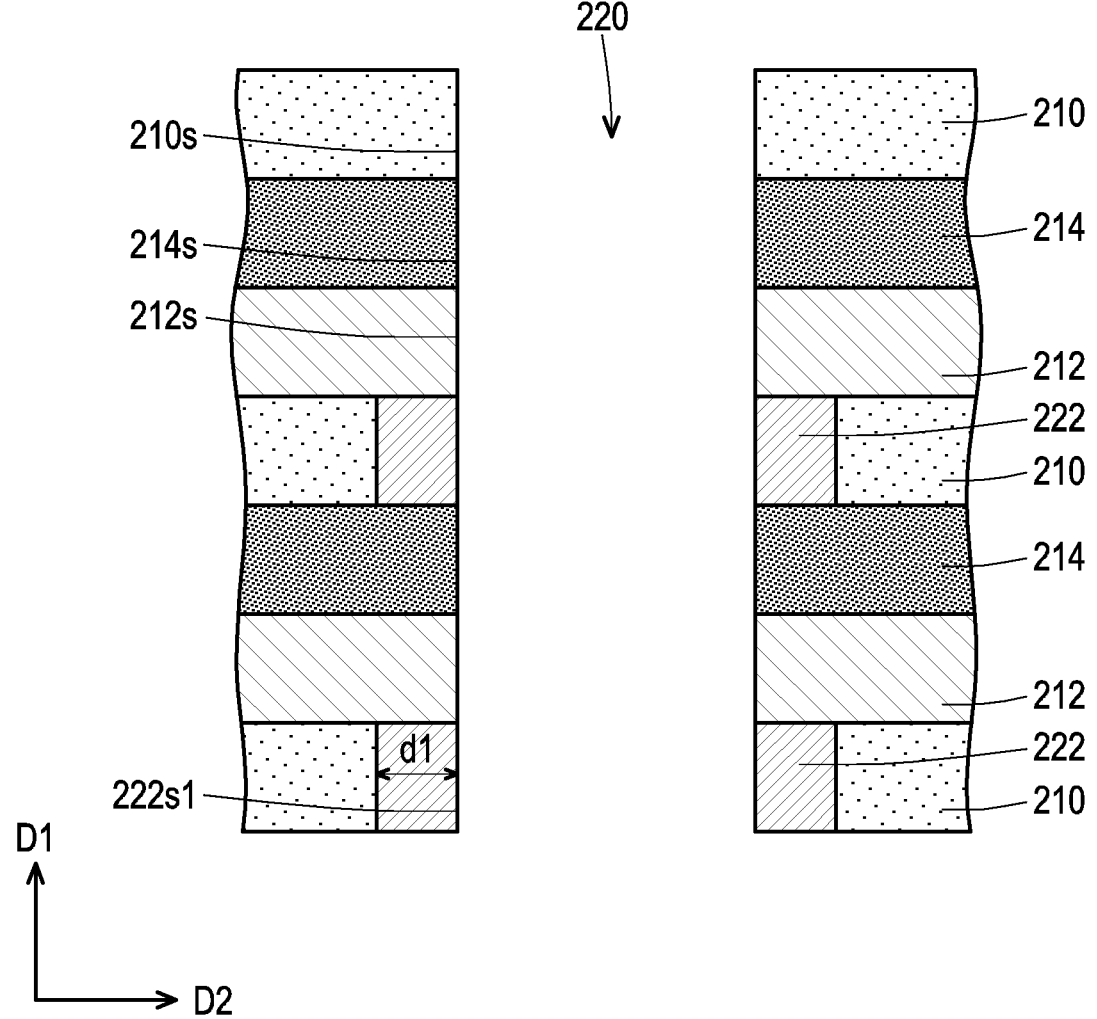

Referring to FIG. 2D, conductive layers 222 are formed to fill up the recesses R1 respectively. The material of the conductive layer 222 may be different from the material of the conductive layer 212. In some embodiments, the conductive layer 222 includes TiN, TaN, W, Ru, Al, the like or a combination thereof. In some embodiments, the conductive layer 222 is formed by a deposition method, such as physical vapor deposition (PVD), atomic layer deposition (ALD), or the like. As shown in FIG. 2D, inner sidewalls 222s1 of the conductive layers 222 are substantially aligned with the inner sidewalls 212s of the conductive layers 212 and the inner sidewalls 214s of the second dielectric layers 214, for example. In some embodiments, the inner sidewalls 224s1 of the selector layers 224 are substantially flush with an inner sidewall 210s of the topmost first dielectric layer 210. A top surface of the conductive layer 222 is substantially coplanar with a top surface of the first dielectric layer 210, for example. The conductive layer 222 may have a dimension d1 along the second direction D2 corresponding to the dimension of the recess R1. In some embodiments, the conductive layers 222 are also referred to as inter-metals, conductive patterns or conductive lines.

Figure 2E:
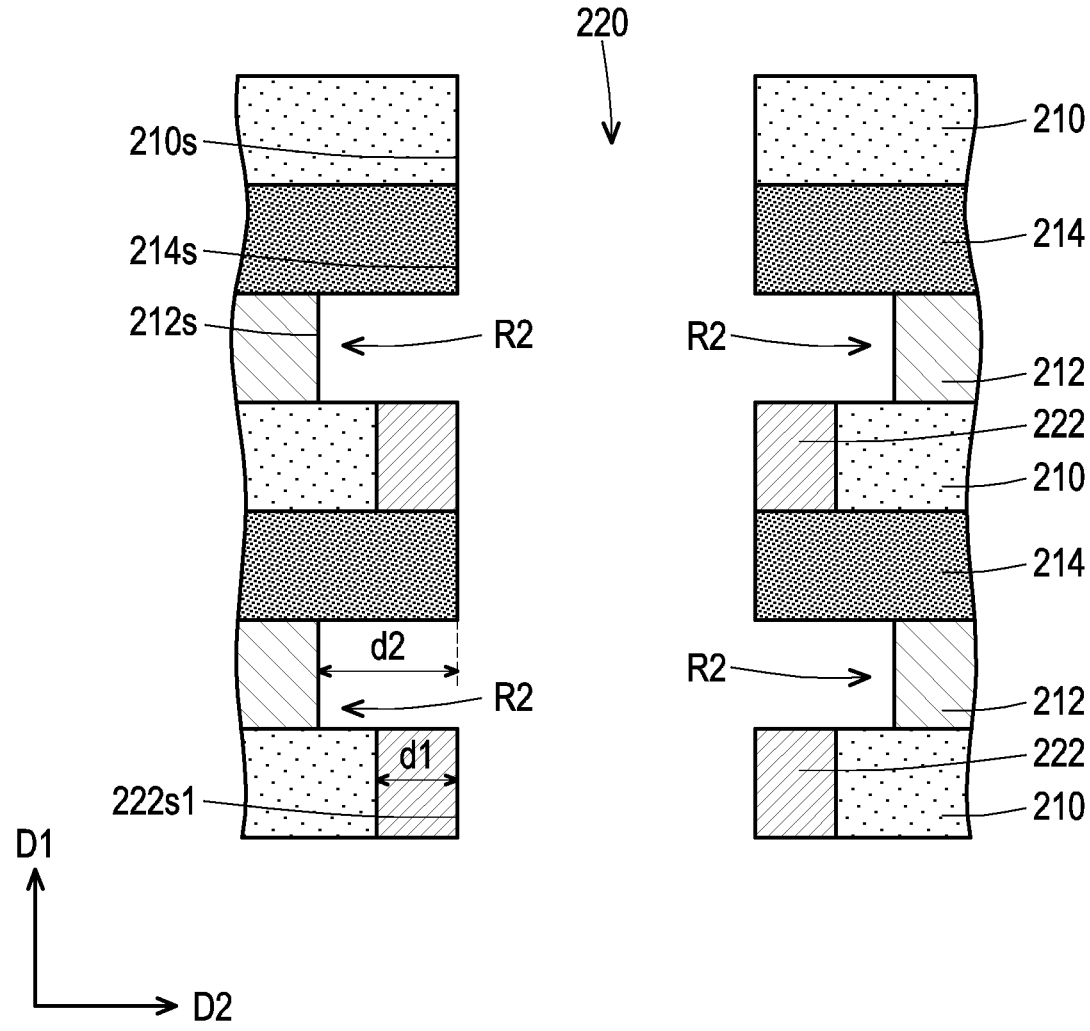

Referring to FIG. 2E, the conductive layers 212 are laterally recessed through the opening 220 by using an etching process. In some embodiments, portions of the conductive layers 212 exposed by the opening 220 are removed, and thus as shown in FIG. 2E, a plurality of recesses R2 are respectively formed between adjacent two of the first dielectric layers 210 and the second dielectric layers 214 and also between adjacent two of the conductive layers 222 and the second dielectric layers 214. In some embodiments, the etching process includes a wet etching process by using a suitable etchant, which has etching selectivity between the conductive layer 212 and the conductive layer 222. The recess R2 exposes the underlying first dielectric layers 210 and conductive layers 222. For example, a dimension d2 of the recess R2 along the second direction D2 (e.g., X direction) is larger than the dimension d1 of the conductive layer 222 along the second direction D2.

Figure 2F:
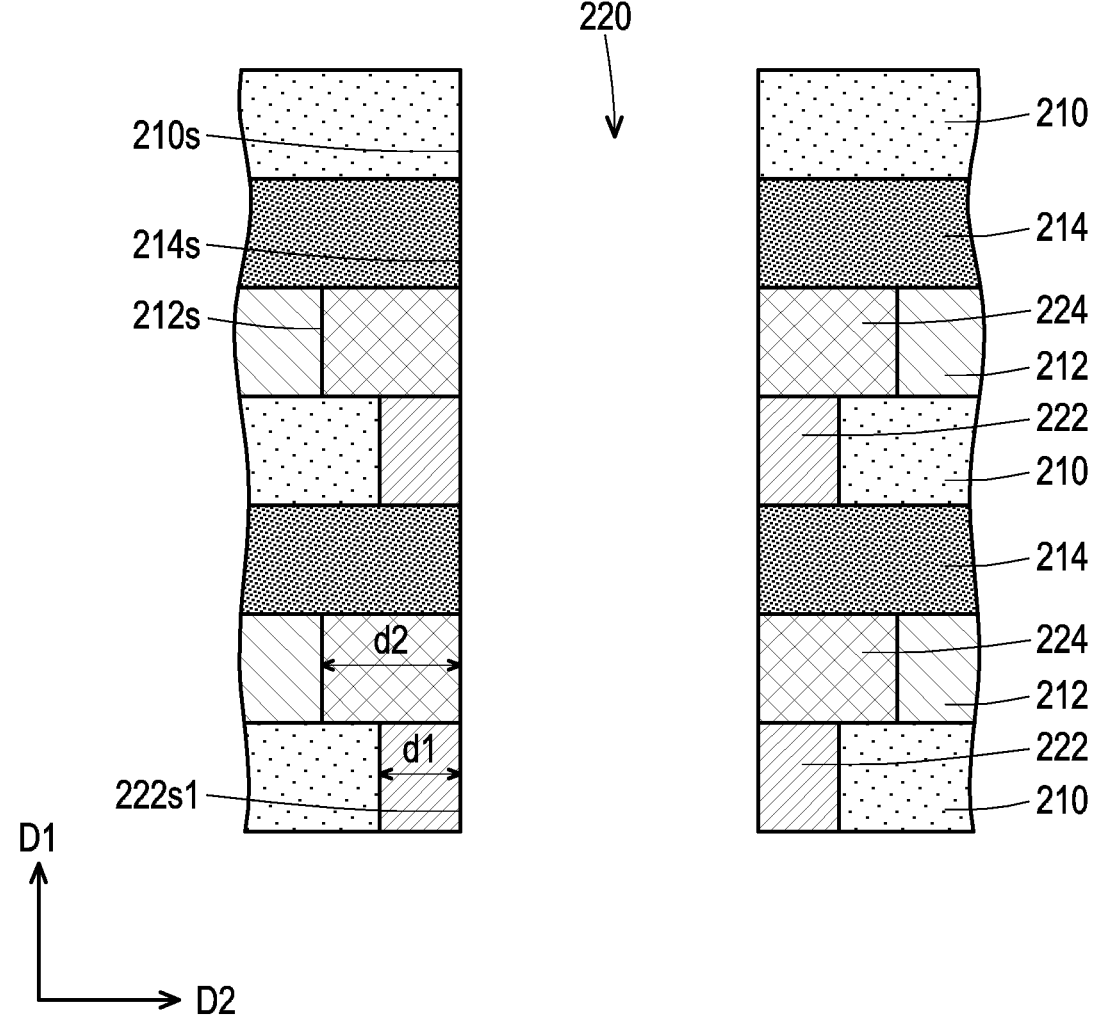

Referring to FIG. 2F, selector layers 224 are formed to fill up the recesses R2. The selector layer 224 is configured to switch between a low resistance state and a high resistance state depending on whether a voltage applied across the selector layer 224 is greater than a threshold voltage. In some embodiments, the selector layer 224 is a threshold-type selector. For example, the selector layer 224 has a high resistance state if a voltage across the selector layer 224 is less than the threshold voltage, and the selector layer 224 has a low resistance state if a voltage across the selector layer 224 is greater than the threshold voltage. In some embodiments, an electron affinity (the energy from vacuum level to conduction band) of the selector layer 224 is in a range of about 3.5 eV to about 4.5 eV. The selector layer 224 may include a chalcogenide material such as CdS, $Ce_2S_3$, $CuInS_2$, $CuIn_5S_8$, $In_2S_3$, PbS, $Sb_2S_3$, ZnS, CdSe, CdTe, $Sb_2Se_3$, a combination thereof or the like. In some embodiments, the selector layer 224 includes an ovonic threshold switch (OTS) material or a voltage conductive bridge (VCB) material. The OTS material may include a binary material such as SiTe, GeTe, CTe, BTe, ZnTe, AlTe, GeSe, GeSb, SeSb, SiAs, GeAs, AsTe and BC, a ternary material such as GeSeAs, GeSeSb, GeSbTe, GeSiAs, GeAsSb, SeSbTe and SiTeSe, or a quadruple material such as GeSeAsTe, GeSe-TeSi, GeSeTeAs, GeTeSiAs, GeSeAsSb and GeSeSbSi. The binary material may be doped with N, O or the like, and the ternary material and the quadruple material may be doped with N, O, C or the like. The VCB material may include at least one metal and at least one oxide, the at least one metal may be selected from Ag, Cu, Al, As, Te and the like, and the oxide may be $SiO_2$, $TiO_2$, $Al_2O_3$, $TaO_2$, $ZrO_2$, a combination thereof or the like. In some embodiments, the selector layer 224 is formed by a deposition method, such as physical vapor deposition (PVD), atomic layer deposition (ALD), or the like.

In some embodiments, as shown in FIG. 2F, inner side-walls 224s1 of the selector layers 224 are substantially aligned with the inner sidewalls 214s of the second dielectric layers 214 and the inner sidewalls 222s1 of the conductive layers 222. In some embodiments, the inner sidewalls 224s1 of the selector layers 224 are substantially flush with the inner sidewall 210s of the topmost first dielectric layer 210. A top surface of the selector layer 224 is substantially coplanar with a top surface of the conductive layer 212, for example. The selector layer 224 may have a dimension d2 along the second direction D2 corresponding to the dimension of the recess R2. In some embodiments, the selector layers 224 are also referred to as selector patterns.

Figure 2G:
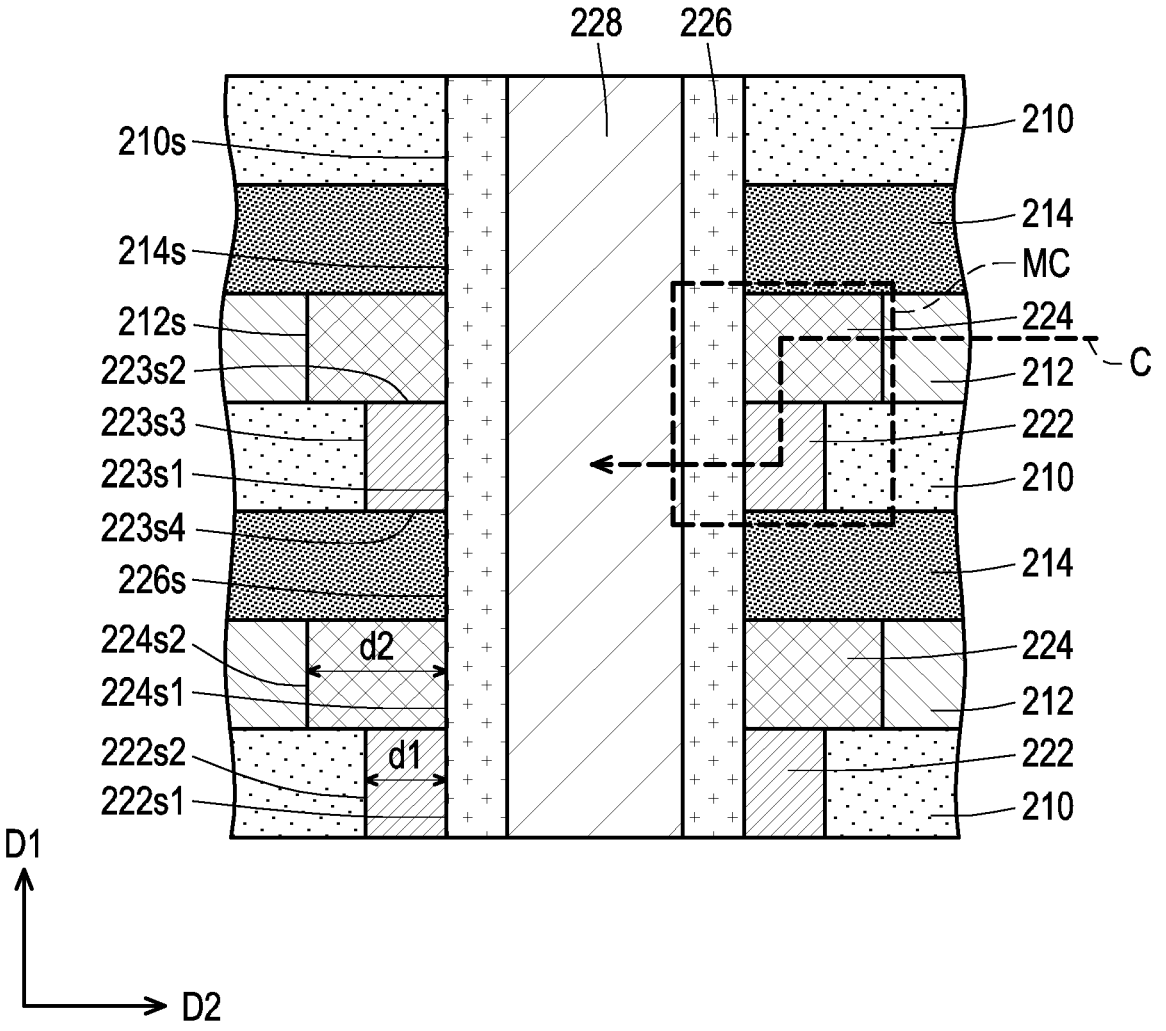

Referring to FIG. 2G, a memory layer 226 is formed in the opening 220 along the inner sidewalls 222s1 of the conductive layers 222, the inner sidewalls 224s1 of the selector layers 224 and the inner sidewalls 214s of the second dielectric layers 214. In some embodiments, the memory layer 226 is further formed along the inner sidewall 210s of the topmost first dielectric layer 210. In some embodiments, the memory layer 226 includes a resistive material and configured to store data by a resistance of the memory layer 226. In some embodiments, the memory layer 226 having a variable resistance is configured to store data states by undergoing reversible changes between a high resistance state associated with a first data state (e.g., a '0') and a low resistance state associated with a second data state (e.g., a '1'). The resistive material may include one or more oxide of W, Ta, Ti, Ni, Co, Hf, Ru, Zr, Zn, Fe, Sn, Al, Cu, Ag, Mo and Cr. In some embodiments, the resistive material further includes silicon to form a composite material. In some embodiments, the memory layer 226 includes hafnium oxide and/or zirconium oxide.

Then, a conductive layer 228 is formed to fill up the opening 220. The conductive layer 228 may include copper, titanium, titanium nitride, tantalum, tantalum nitride, tungsten, ruthenium, aluminum, combinations thereof, or the like, which may be formed using, for example, CVD, ALD, PVD, PECVD, or the like. The conductive layer 228 may be formed by depositing a conductive material and performing a planarization (e.g., a CMP, etch back, or the like) to remove excess portions of the conductive material outside the opening 220. In the resulting structure, top surfaces of the multi-layer stack 202 (e.g., the topmost first dielectric layer 210), the memory layer 226 and the conductive layer 228 may be substantially level (e.g., within process variations). In some embodiments, the conductive layer 228 is extended in the first direction D1, and the conductive layer 212 is extended in the second direction D2. The conductive layer 228 may be also referred to as a conductive pillar, a conductive line or a conductive pattern.

The conductive layer 222 may be disposed between and in direct contact with the memory layer 226 and the first dielectric layer 210. The selector layer 224 may be disposed between and in direct contact with the memory layer 226 and the conductive layer 212. In some embodiments, the selector layers 224 are disposed at opposite sides of the conductive layer 228 (also the memory layer 226), and similarly, the conductive layers 222 are disposed at opposite sides of the conductive layer 228 (also the memory layer 226). For example, the conductive layer 228 (also the memory layer 226) is disposed between the selector layers 224 and between the conductive layers 222. The selector layer 224 and the conductive layer 222 may be disposed on outer sidewalls 226s of the memory layer 226 at different heights. For example, the conductive layer 222 is disposed at a first height, and the selector layer 224 is disposed at a second height larger than the first height. That is, the selector layer 224 may be disposed on the conductive layer 222. In some embodiments, a distance (e.g., dimension d2) from the outer sidewall 226s of the memory layer 226 to an outer sidewall 224s2 of the selector layer 224 is larger than a distance (e.g., dimension d1) from the outer sidewall 226s of the memory layer 226 to an outer sidewall 222s2 of the conductive layer 222. In other words, the outer sidewall 224s2 of the selector layer 224 extends beyond the outer sidewall 222s2 of the conductive layer 222. In such embodiments, the dimension d2 of the selector layer 224 is larger than the dimension d1 of the conductive layer 222.

In some embodiments, as shown in FIG. 2G, a first side 223s1 of the conductive layer 222 is covered by (e.g., in direct contact with) the memory layer 226. A second side 223s2 immediately adjacent to (i.e., connecting to) the first side 223s1 of the conductive layer 222 is covered (e.g., in direct contact with) by the selector layer 224 while other sides (e.g., third side 223s3 and fourth side 223s4) are exposed by the selector layer 224. In other words, except the side (e.g., first side) covered by the memory layer 226, at least one side (e.g., third side 223s3 and fourth side 223s4) of the conductive layer 222 is not in physical contact with (e.g., not surrounded by or not physically connected to) the selector layer 224. In some embodiments, the third side 223s3 opposite to the first side 223s1 of the conductive layer 222 is in direct contact with the first dielectric layer 210, and the fourth side 223s4 opposite to the second side 223s2 of the conductive layer 222 is in direct contact with the second dielectric layer 214.

In some embodiments, the conductive layer 228 corresponds to and is electrically connected to a bit line in the memory array while the conductive layer 212 corresponds to and is electrically connected to a word line in the memory array. In some embodiments, the memory cell MC is operably coupled to the word line, the source line (not shown) and the bit line. In some embodiments, the memory cell MC may have a one-selector-one resistor (1S1R) configuration. In other words, there are a selector and a resistor connected in series in each memory cell MC. In some embodiments, the current C from the conductive layer 212 passes to the memory cell MC through the selector layer 224, the conductive layer 222 and the memory layer 226 sequentially. The 1S1R configuration may be applied to, for example, RRAM devices.

Figure 3A:
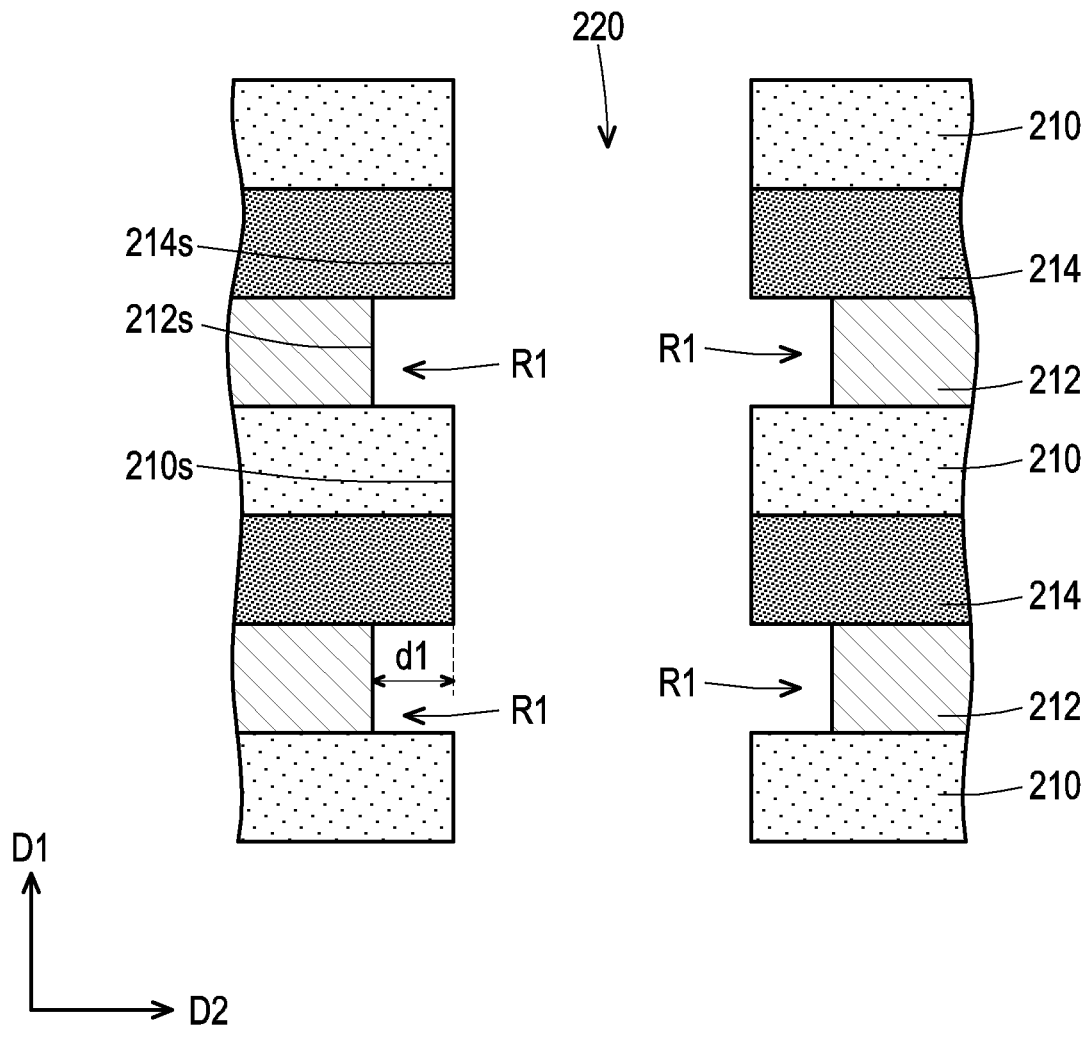
FIG. 3A to FIG. 3F are cross-sectional views illustrating various stages of a manufacturing method of a memory device.
Figure 3B:
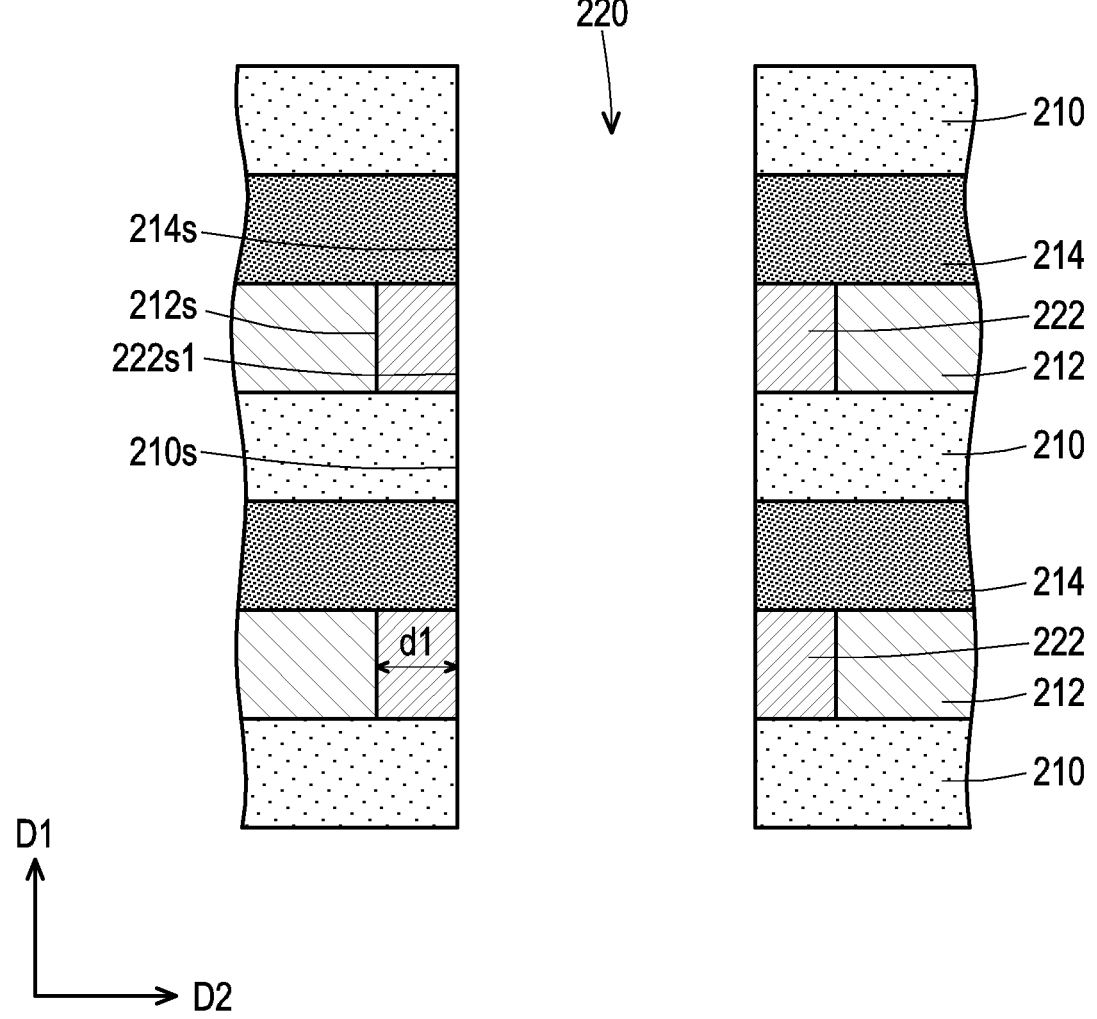
Figure 3C:
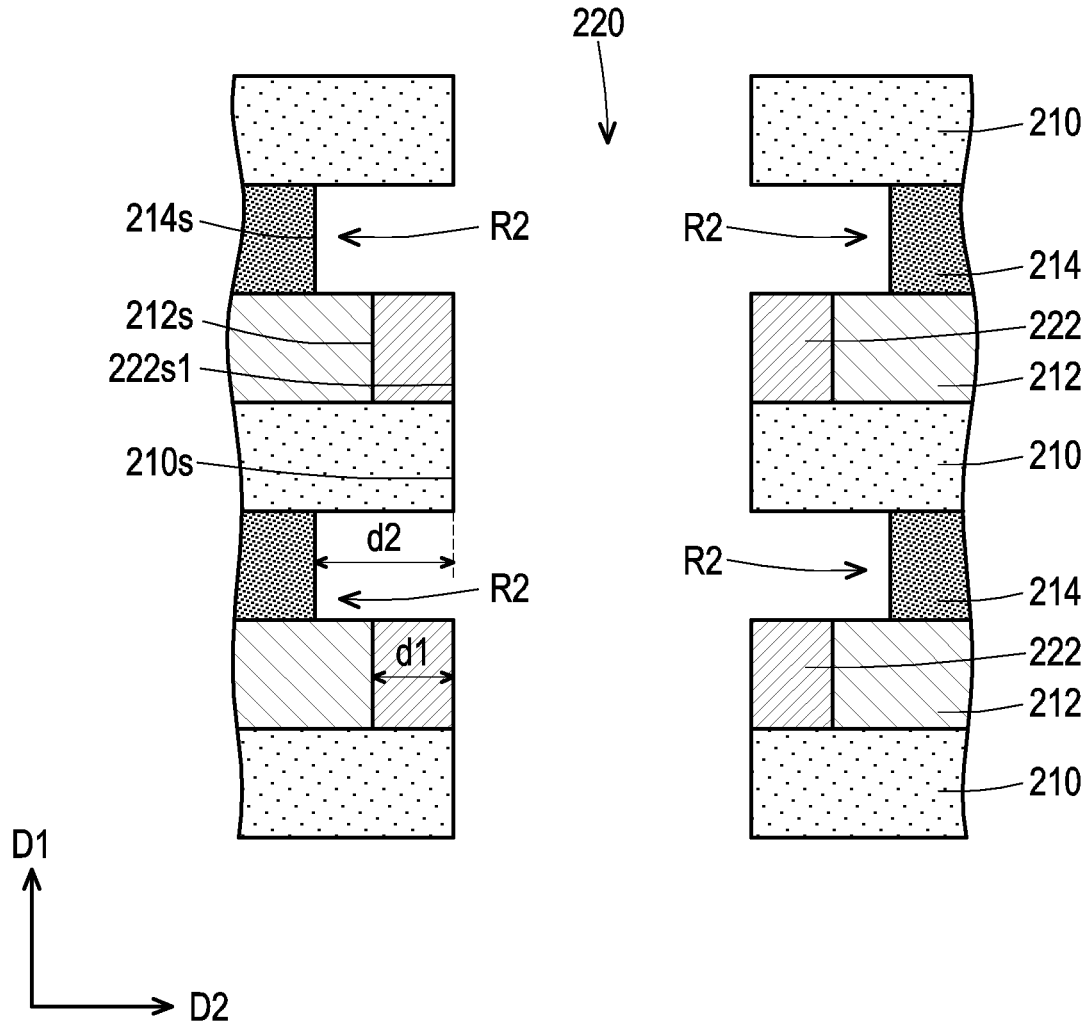
Figure 3D:
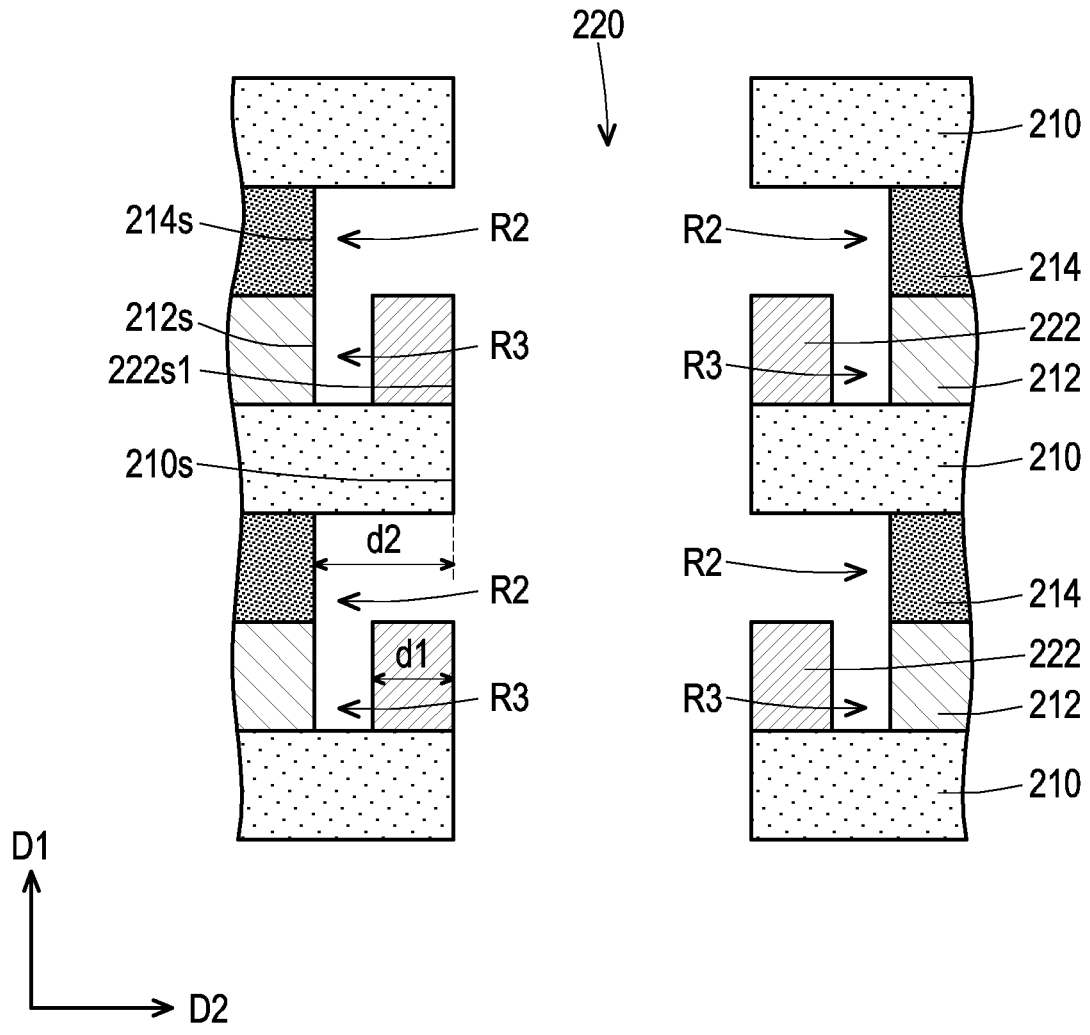
Figure 3E:
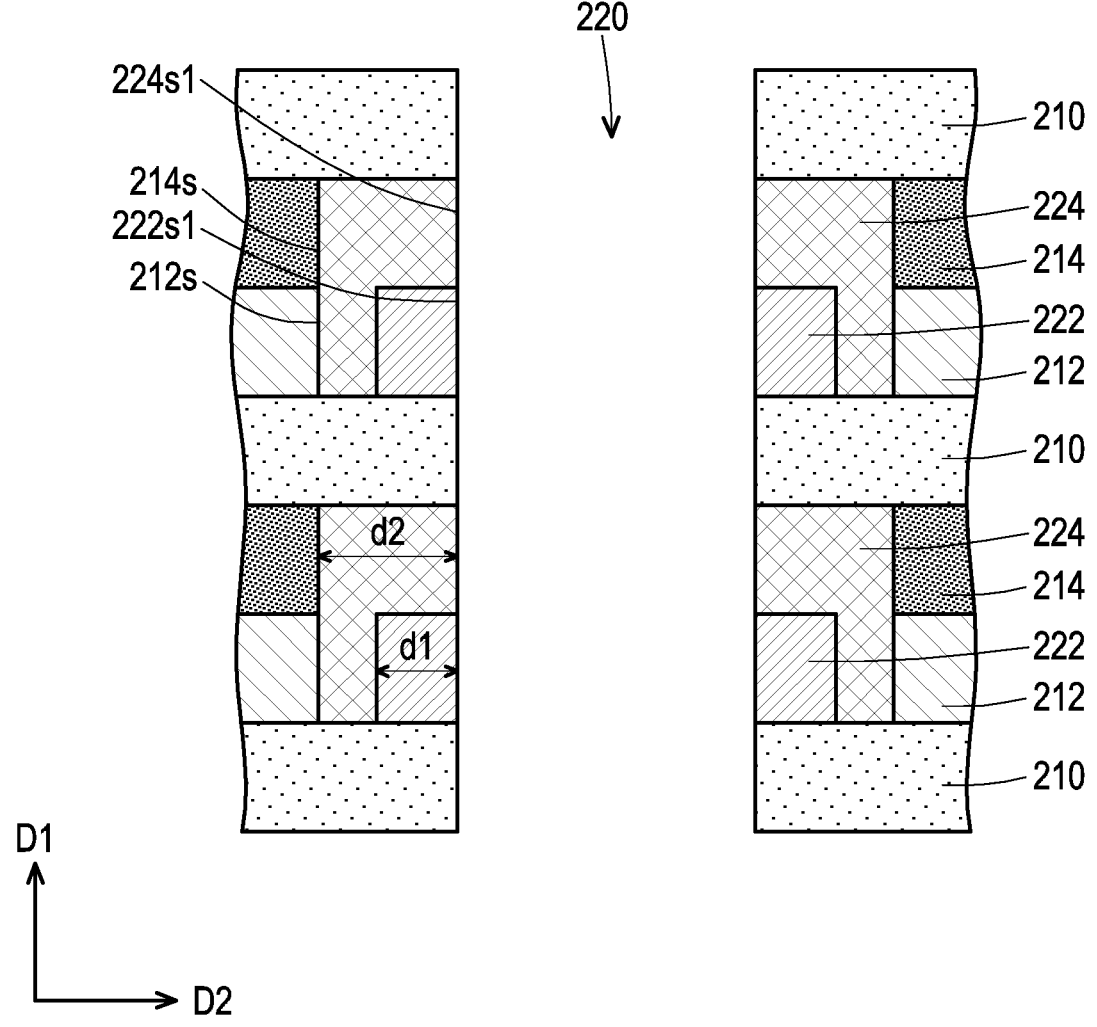
Figure 3F:
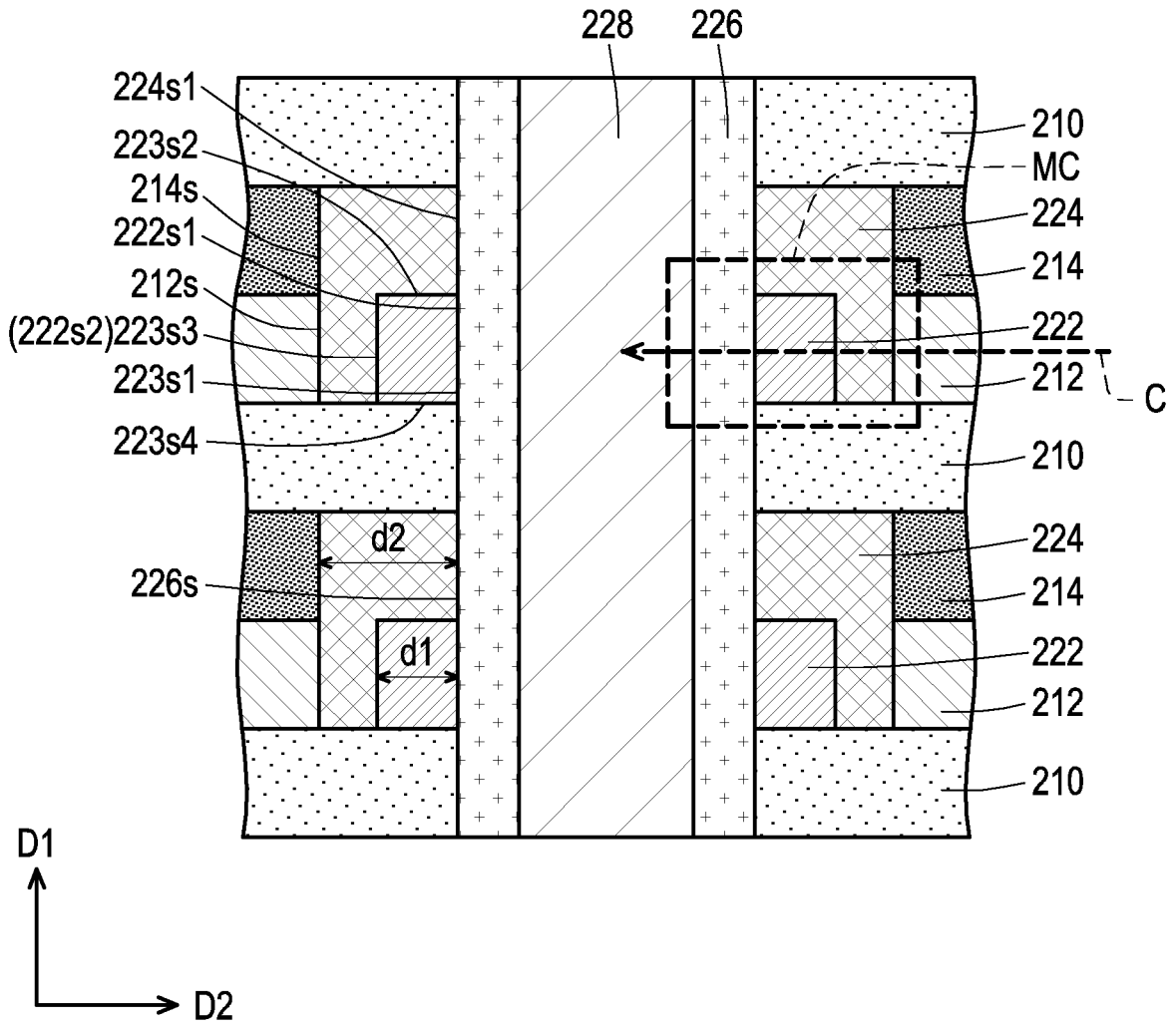

FIG. 3A to FIG. 3F are cross-sectional views illustrating various stages of a manufacturing method of a memory device. According to some embodiments, the memory device may be a three-dimensional (3D) memory device with a resistive material. The memory devices depicted in the following paragraphs may be used as the memory devices 120 and 130 in FIG. 1. The memory device of FIG. 3F is similar to the memory device of FIG. 2G, and the difference lies in the formation and the configuration of the selector layer 224 and the conductive layer 222.

Referring to FIG. 3A, a multi-layer stack having an opening 220 is provided. The multi-layer stack having the opening 220 may be similar to that of FIG. 2B. Then, the conductive layers 212 are laterally recessed through the opening 220 by using an etching process. In some embodiments, portions of the conductive layers 212 exposed by the opening 220 are removed, and thus a plurality of recesses R1 are respectively formed. In some embodiments, the recesses R1 are formed between adjacent two of the first dielectric layers 210 and the second dielectric layers 214. In some embodiments, the etching process includes a wet etching process by using a suitable etchant. In some embodiments, the recess R1 has a dimension d1 along a second direction D2 (e.g., X direction).

Referring to FIG. 3B, conductive layers 222 are formed to fill up the recesses R1. The material of the conductive layer 222 may be different from the material of the conductive layer 212. In some embodiments, the conductive layer 222 includes TiN, TaN, W, Ru, Al, the like or a combination thereof. In some embodiments, the conductive layer 222 is formed by a deposition method, such as physical vapor deposition (PVD), atomic layer deposition (ALD), or the like. In some embodiments, as shown in FIG. 3B, inner sidewalls 222s1 of the conductive layers 222 are substantially aligned with the inner sidewalls 210s of the first dielectric layers 210 and the inner sidewalls 214s of the second dielectric layers 214. A top surface of the conductive layer 222 is substantially coplanar with a top surface of the conductive layer 212, for example. The conductive layer 222 may have a dimension d1 along the second direction D2 corresponding to the dimension of the recess R1. The conductive layer 222 may be in direct contact with the conductive layer 212. In some embodiments, the conductive layers 222 are also referred to as inter-metals, conductive patterns or conductive lines.

Referring to FIG. 3C, the second dielectric layers 214 are laterally recessed through the opening 220 by using an etching process. In some embodiments, portions of the second dielectric layers 214 exposed by the opening 220 are removed, and thus a plurality of recesses R2 are formed. In some embodiments, a dimension d2 of the recess R2 along the second direction D2 (e.g., X direction) is larger than the dimension d1 of the conductive layer 222 along the second direction D2. Thus, the recess R2 exposes both the underlying conductive layer 222 and conductive layer 212.

Referring to FIG. 3D, the exposed portions of the conductive layers 212 are removed through the recesses R2, to form a plurality of recesses R3 by using an etching process. In some embodiments, the etching process includes a wet etching process by using a suitable etchant, which has etching selectivity between the conductive layer 212 and the conductive layer 222. The recesses R3 connect to (e.g., communicate with) the recesses R2, respectively. In some embodiments, after partial removal, the inner sidewalls 212s of the remained conductive layers 212 are substantially flush with the inner sidewalls 214s of the second dielectric layers 214. In some embodiments, a dimension of the recess R3 along the second direction D2 (e.g., X direction) is substantially equal to a difference between the dimension d2 of the recess R2 and the dimension d1 of the conductive layer 222 along the second direction D2.

Referring to FIG. 3E, selector layers 224 are formed to fill up the recesses R2 and the recesses R3. For example, the selector layer 224 is formed to cover the conductive layer 222 and fills up the recess R2 and the recess R3. The selector layer 224 may be in direct contact with the conductive layer 222, the first dielectric layer 210, the conductive layer 212 and the second dielectric layer 214. In some embodiments, as shown in FIG. 3E, inner sidewalls 224s1 of the selector layers 224 are substantially aligned with the inner sidewalls 222s1 of the conductive layers 222 and the inner sidewalls 210s of the first dielectric layers 210. In some embodiments, the selector layers 224 are also referred to as selector patterns.

Referring to FIG. 3F, a memory layer 226 is formed on sidewalls of the opening 220, and a conductive layer 228 is formed to fill up the opening 220. In some embodiments, the selector layers 224 are disposed at opposite sides of the conductive layer 228 (also the memory layer 226), and similarly, the conductive layers 222 are disposed at opposite sides of the conductive layer 228 (also the memory layer 226). For example, the conductive layer 228 (also the memory layer 226) is disposed between the selector layers 224 and between the conductive layers 222. The selector layer 224 and the conductive layer 222 may be disposed on outer sidewalls 226s of the memory layer 226 at different heights. For example, the selector layer 224 is disposed on the conductive layer 222 to cover a top surface and an outer sidewall 222s2 of the conductive layer 222. In some embodiments, the first side 223s1 of the conductive layer 222 is covered by (e.g., in direct contact with) the memory layer 226. The second side 223s2 and the third side 223s3 of the conductive layer 222 are covered (e.g., in direct contact with) by the selector layer 224 while other side (e.g., fourth side 223s4) is exposed by the selector layer 224. In other words, except the side (e.g., first side) covered by the memory layer 226, at least one side (e.g., fourth side 223s4) of the conductive layer 222 is not in physical contact with (e.g., not surrounded by or not physically connected to) the selector layer 224. For example, the fourth side 223s4 of the conductive layer 222 is in direct contact with the first dielectric layer 210. In some embodiments, a top surface of the selector layer 224 is substantially coplanar with a top surface of the second dielectric layer 214, and a bottom surface of the selector layer 224 is substantially coplanar with bottom surfaces of the conductive layer 222 and the conductive layer 212.

In some embodiments, the conductive layer 228 corresponds to and is electrically connected to a bit line in the memory array while the conductive layer 212 corresponds to and is electrically connected to a word line in the memory array. In some embodiments, the memory cell MC is operably coupled to the word line, the source line (not shown) and the bit line. In some embodiments, the memory cell MC may have a one-selector-one resistor (1S1R) configuration. In other words, there are a selector and a resistor connected in series in each memory cell MC. In some embodiments, the current C from the conductive layer 212 passes to the memory cell MC through the selector layer 224 between the conductive layer 212 and the conductive layer 222, the conductive layer 222 and the memory layer 226 sequentially. The 1S1R configuration may be applied to, for example, RRAM devices.

FIG. 4A to FIG. 4E are cross-sectional views illustrating various stages of a manufacturing method of a memory device of FIG. 3F in accordance with some embodiments. In other words, FIG. 4A to FIG. 4E depict another formation method of the selector layer 224 and the conductive layer 222.

Figure 4A:
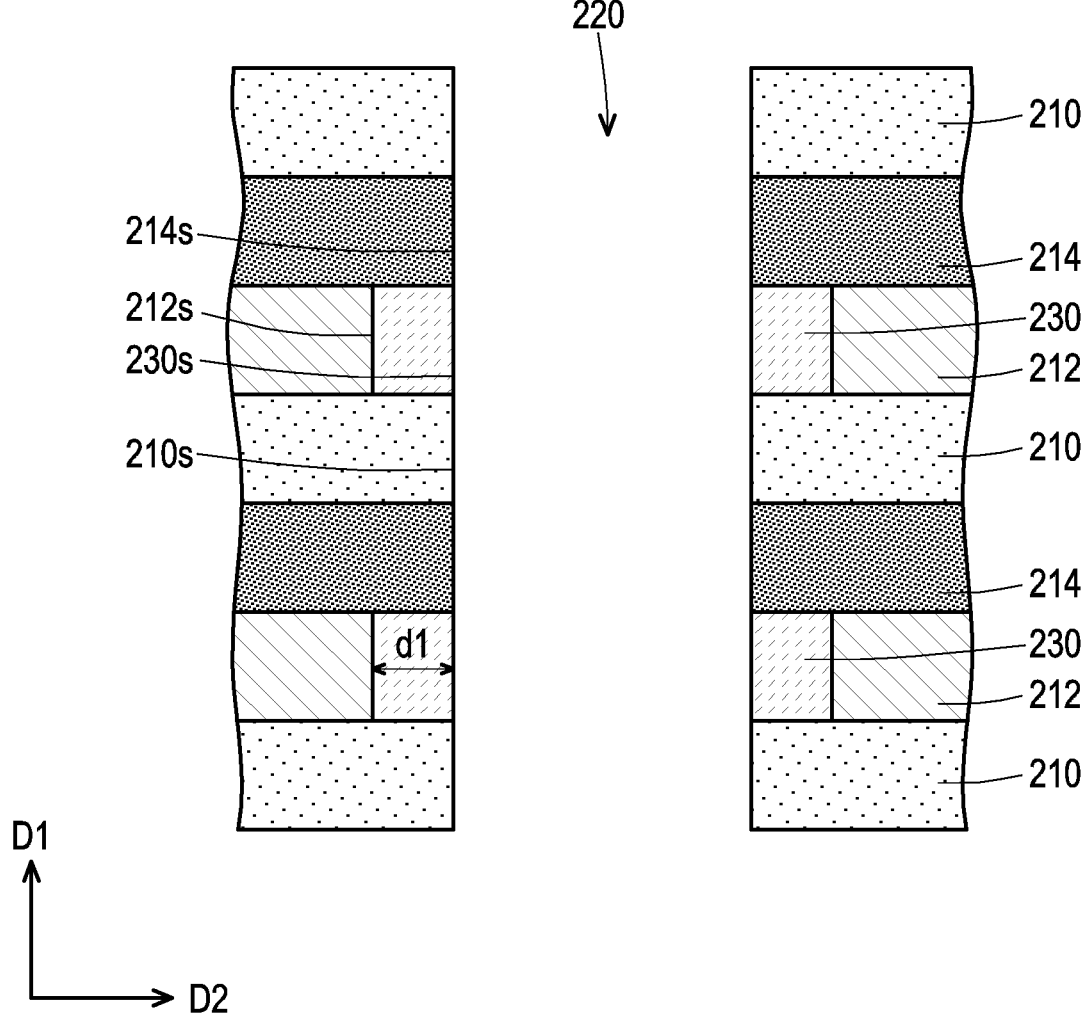
FIG. 4A to FIG. 4E are cross-sectional views illustrating various stages of a manufacturing method of a memory device.

Referring to FIG. 4A, similar to FIG. 3A, the conductive layers 212 are laterally recessed through the opening 220, to form a plurality of recesses R1. Then, sacrificial layers 230 are formed to fill up the recesses R1. In some embodiments, the material of the sacrificial layer 230 is not particularly limited, as long as said material renders good etching selectivity between the sacrificial layer 230 and the first dielectric layer 210, the conductive layer 212 and the second dielectric layer 214. The sacrificial layer 230 may be formed of any suitable dielectric material, such as silicon oxide, silicon nitride, silicon oxynitride, phosphosilicate glass (PSG), borosilicate glass (BSG), boron-doped phosphosilicate glass (BPSG), or low-k materials. In some embodiments, inner sidewalls 230s of the sacrificial layers 230 are substantially aligned with the inner sidewalls 210s of the first dielectric layers 210 and the inner sidewalls 214s of the second dielectric layers 214. The sacrificial layer 230 may have a dimension d1 along the second direction D2 corresponding to the dimension of the recess R1 (as shown in FIG. 1A). In some embodiments, the sacrificial layers 230 are also referred to as dielectric layers, sacrificial patterns or dielectric patterns.

Figure 4B:
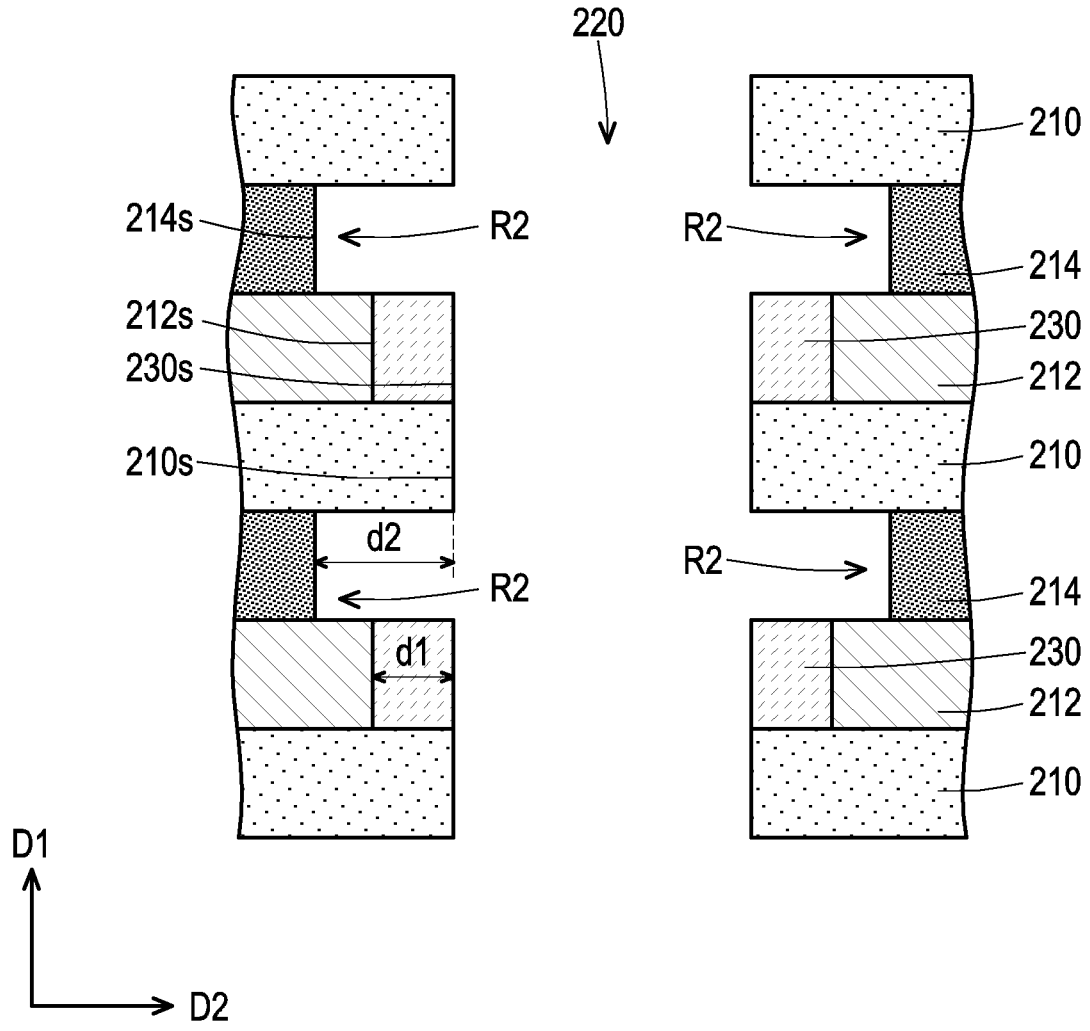

Referring to FIG. 4B, the second dielectric layers 214 are laterally recessed through the opening 220 by using an etching process. In some embodiments, portions of the second dielectric layers 214 exposed by the opening 220 are removed, and thus a plurality of recesses R2 are respectively formed. In some embodiments, a dimension d2 of the recess R2 along the second direction D2 (e.g., X direction) is larger than the dimension d1 of the sacrificial layer 230 along the second direction D2. Thus, the recess R2 exposes both the underlying sacrificial layer 230 and conductive layers 212.

Figure 4C:
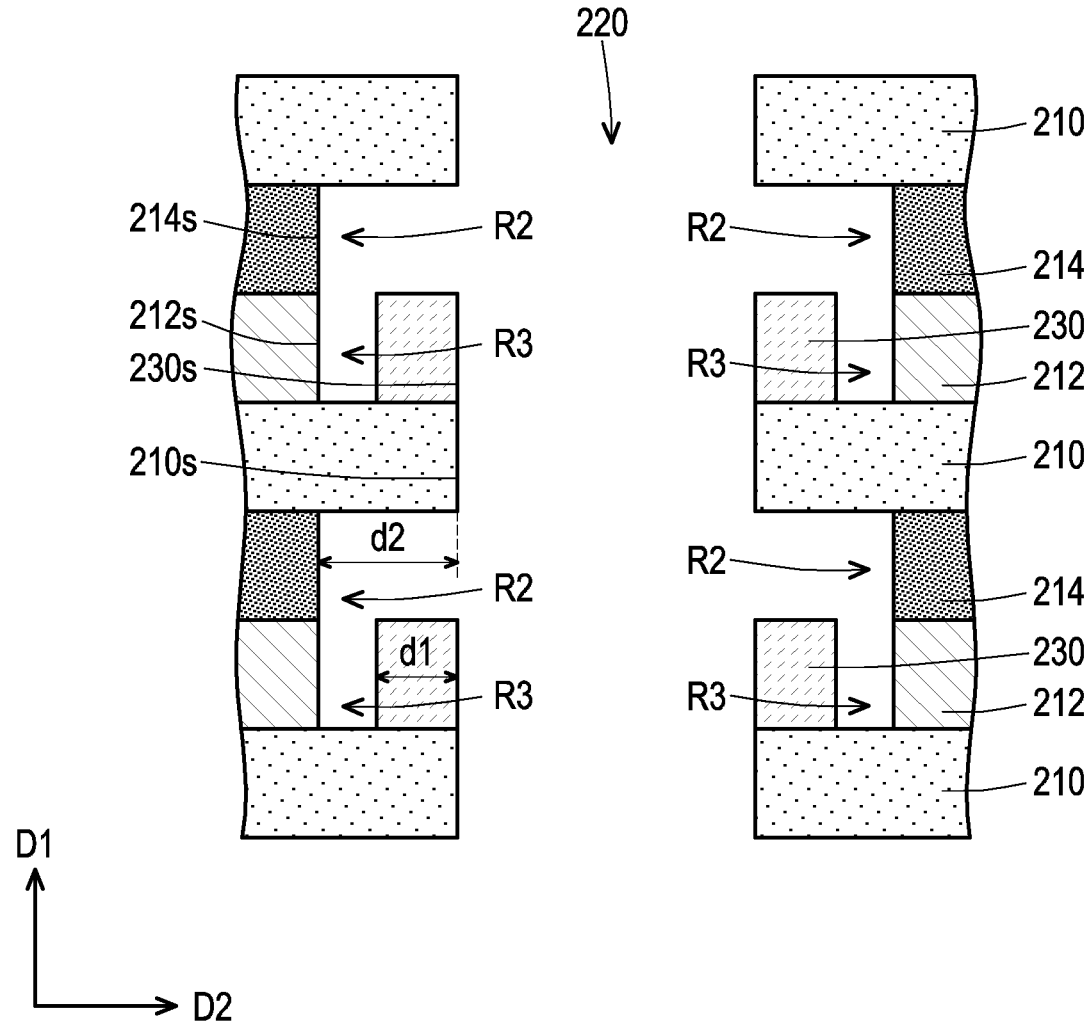

Referring to FIG. 4C, the exposed portions of the conductive layers 212 are removed through the recesses R2, to form a plurality of recesses R3 by using an etching process. In some embodiments, the etching process includes a wet etching process by using a suitable etchant, which has etching selectivity between the conductive layer 212 and the sacrificial layers 230. The recesses R3 connect to (e.g., communicate with) the recesses R2, respectively. In some embodiments, after partial removal, the inner sidewalls 212s of the remained conductive layers 212 are substantially flush with the inner sidewalls 214s of the second dielectric layers 214. In some embodiments, a dimension of the recess R3 along the second direction D2 (e.g., X direction) is substantially equal to a difference between the dimension d2 of the recess R2 and the dimension d1 of the conductive layer 222 along the second direction D2.

Figure 4D:
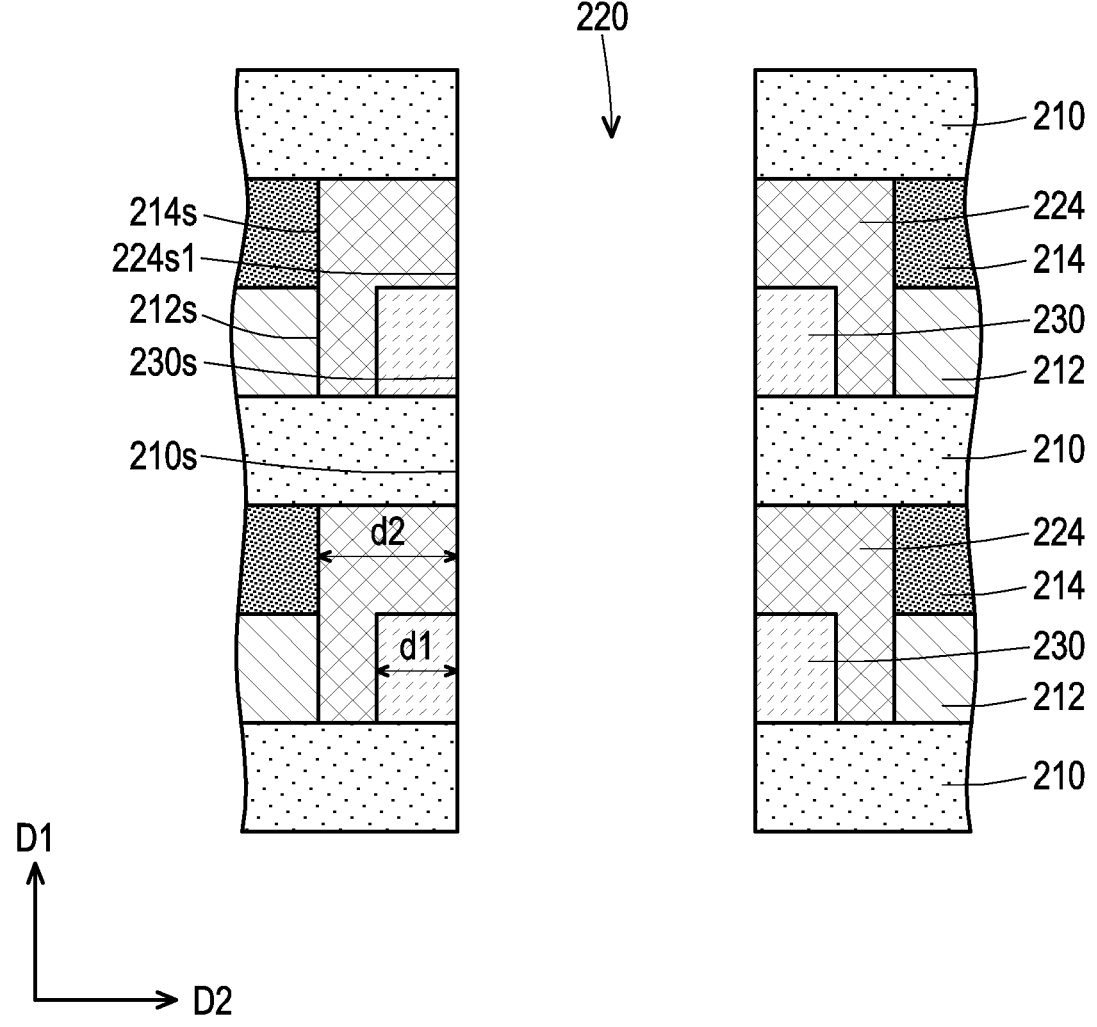

Referring to FIG. 4D, selector layers 224 are formed to fill up the recesses R2 and the recesses R3. For example, the selector layer 224 is formed to cover the sacrificial layer 230 and fills up the recess R2 and the recess R3. The selector layer 224 may be in direct contact with the sacrificial layer 230, the first dielectric layer 210, the conductive layer 212 and the second dielectric layer 214. In some embodiments, as shown in FIG. 4D, inner sidewalls 224s1 of the selector layers 224 are substantially aligned with the inner sidewalls

230s of the sacrificial layers 230 and the inner sidewalls 210s of the first dielectric layers 210.

Figure 4E:
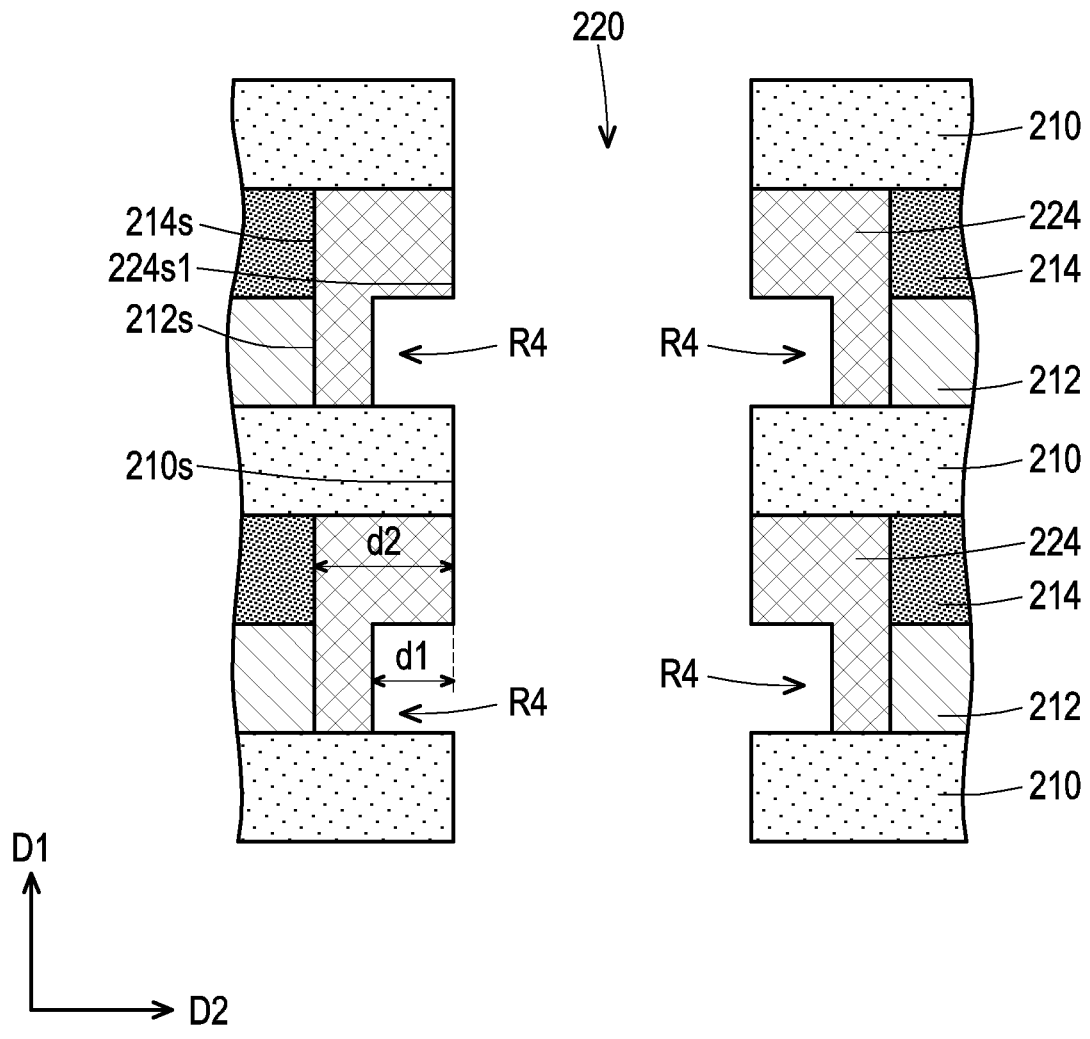

Referring to FIG. 4E, the sacrificial layers 230 are removed to form recesses R4 by using an etching process. In some embodiments, the recesses R4 are formed respectively between the selector layers 224 and the first dielectric layers 210. The recesses R4 connect to (e.g., communicate with) the opening 220. In some embodiments, the recess R4 has a dimension d1 along the second direction D2 (e.g., X direction) corresponding to the sacrificial layer 230. Then, the conductive layers 222 are formed to fill up the recesses R4, so as to form a structure as shown in FIG. 3E. After that, a memory layer 226 is formed in the opening 220, and a conductive layer 228 is formed to fill up the opening 220. Thus, the memory device of FIG. 3F is formed.

FIG. 5A to FIG. 7 illustrate varying views of a method of forming a memory device in accordance with some embodiments. FIG. 5A to FIG. 5E illustrate top views of stages of forming a memory device. FIG. 6A, FIG. 6B, FIG. 6D and FIG. 6E illustrate cross-sectional views taken along lines I-I' of FIG. 5A, FIG. 5B, FIG. 5D and FIG. 5E, and FIG. 6C illustrates a cross-sectional view taken along line II-II' of FIG. 5C. According to some embodiments, the memory device may be a three-dimensional (3D) memory device with a resistive material. The memory devices depicted in the following paragraphs may be used as the memory devices 120 and 130 in FIG. 1.

Figure 5A:
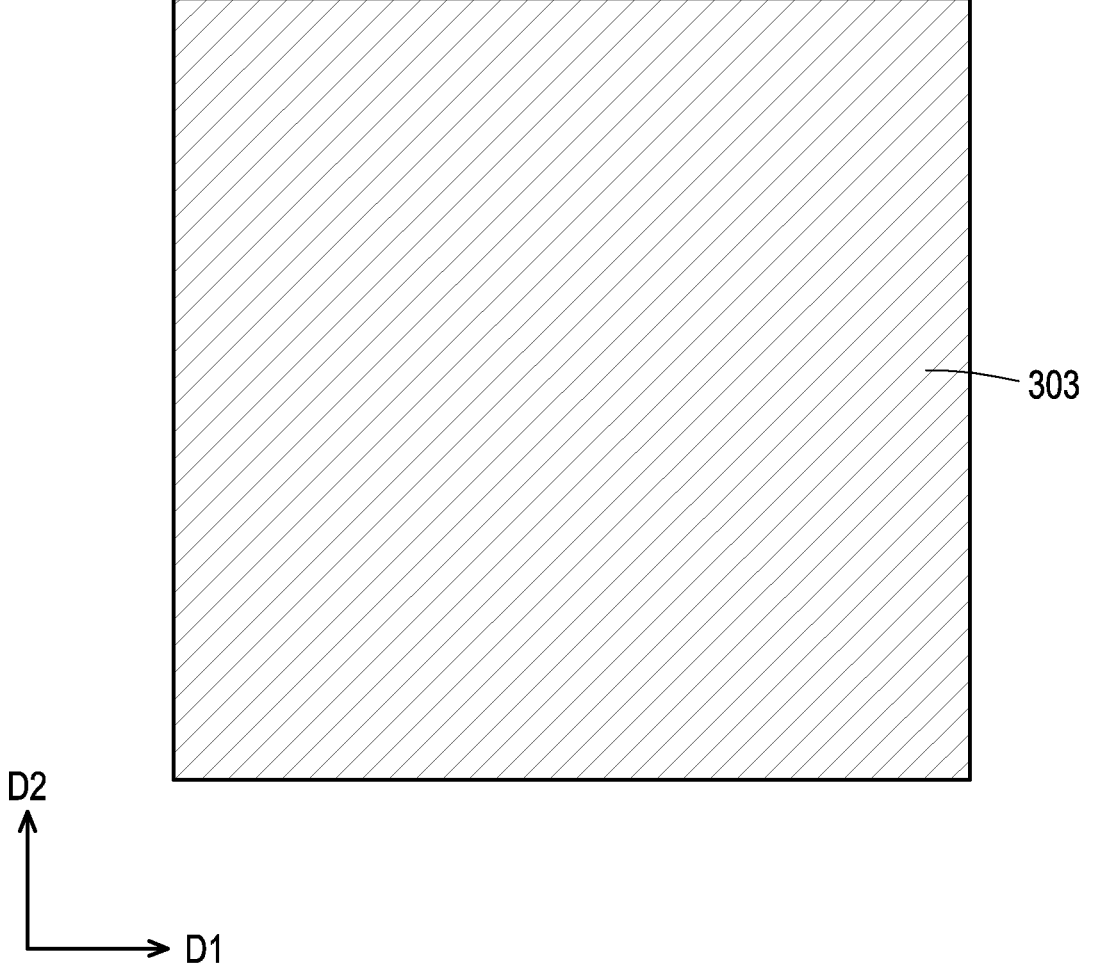
FIG. 5A to FIG. 7 illustrate varying views of a method of forming a memory device in accordance with some embodiments.
Figure 6A:
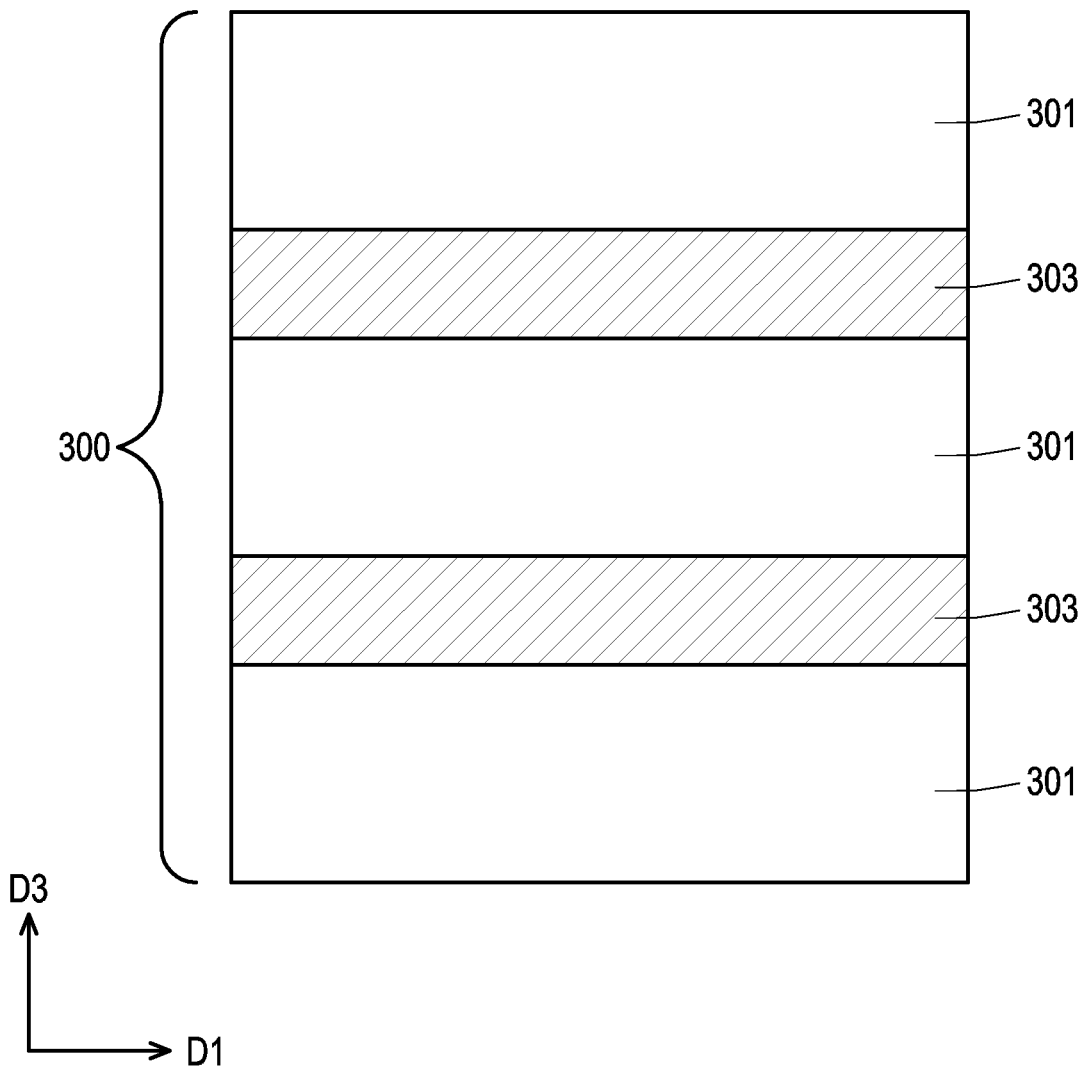

Referring to FIG. 5A and FIG. 6A, a multi-layer stack 300 is formed. In some embodiments, the multi-layer stack 300 includes a plurality of dielectric layers 301 and a plurality of conductive layers 303. As shown in FIG. 5A, the dielectric layers 301 and the conductive layers 303 are extended along a first direction D1 (e.g., X direction) and a second direction D2 (e.g., Y direction) substantially perpendicular to the first direction D1. As shown in FIG. 6A, the dielectric layers 301 and the conductive layers 303 are alternately stacked in a third direction D3 (e.g., Z direction) substantially perpendicular to the first direction D1 and the second direction D2. The first direction D1 and the second direction D2 are horizontal directions, and the third direction D3 is a vertical direction, for example.

In some embodiments, the dielectric layer 301 is formed of any suitable dielectric material, such as silicon oxide, silicon nitride, silicon oxynitride, phosphosilicate glass (PSG), borosilicate glass (BSG), boron-doped phosphosilicate glass (BPSG), or low-k materials, formed by a suitable method, such as spin coating, physical vapor deposition (PVD), chemical vapor deposition (CVD), or the like. The dielectric layer 301 may have a single layer or multilayer structure. In some embodiments, the conductive layer 303 includes TiN, TaN, W, Ru, Al, the like or a combination thereof. In some embodiments, the conductive layer 303 is made by a single material such as TiN. In some embodiments, the conductive layer 303 is a multi-layer structure. For example (not shown), the conductive layer 303 includes two barrier layers and a metal layer between the barrier layers. Specifically, a barrier layer is disposed between the metal layer and the adjacent dielectric layers 301. The barrier layers may prevent the metal layer from diffusion to the adjacent dielectric layers 301. The barrier layers may also provide the function of increasing the adhesion between the metal layer and the adjacent dielectric layers, and may be referred to as glue layers in some examples. In some embodiments, both barrier layers and glue layers with different materials are provided as needed. The barrier layers are formed of a first conductive material, such as a metal nitride, such as titanium nitride, tantalum nitride, molybdenum nitride, zirconium nitride, hafnium nitride, or the like. The metal layer may be formed of a second conductive material, such as a metal, such as tungsten, ruthenium, molybdenum, cobalt, aluminum, nickel, copper, silver, gold, alloys thereof, or the like. The barrier layers and metal layer may each be formed by an acceptable deposition process such as CVD, PVD, ALD, PECVD, or the like.

Figure 5B:
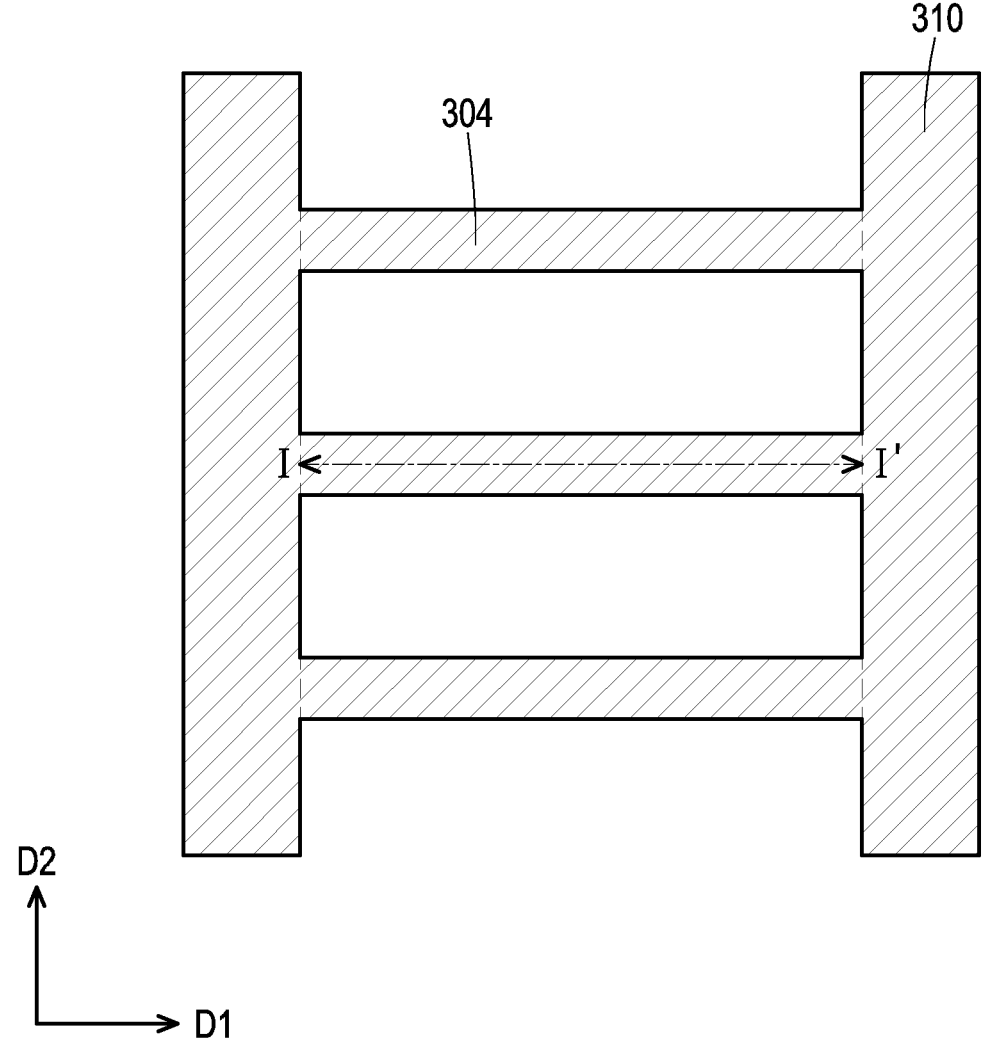
Figure 6B:
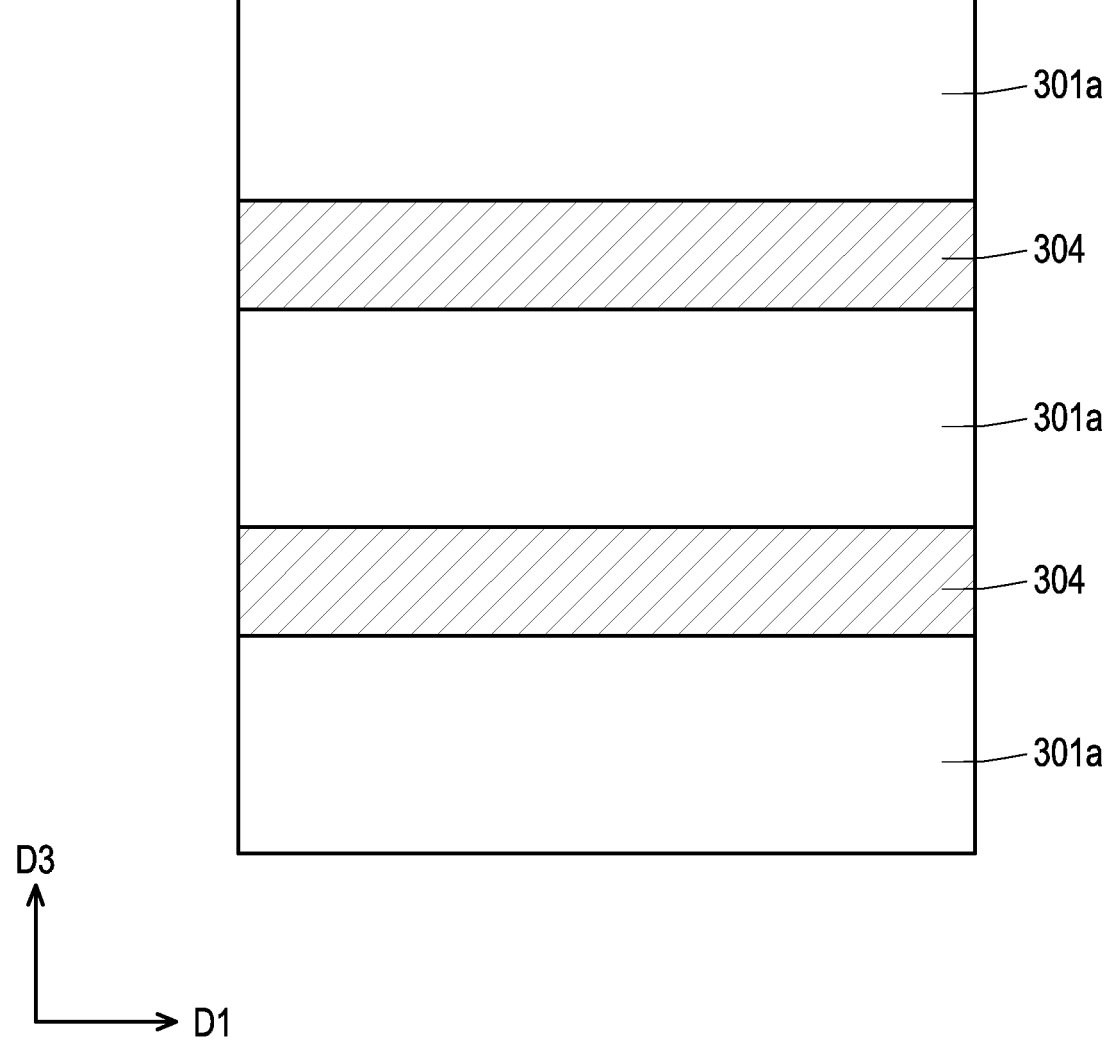

Referring to FIG. 5B and FIG. 6B, the multi-layer stack 300 is patterned, to form a plurality of conductive lines 304, 310 and a plurality of patterned dielectric layers 301a. As shown in FIG. 5B, the conductive lines 304 are extended along the first direction D1 (e.g., X direction), and the conductive lines 310 are extended along the second direction D2 (e.g., Y direction) substantially perpendicular to the first direction D1. The conductive lines 304 are arranged along the second direction D2, and the conductive lines 310 are arranged along the first direction D1. In some embodiments, the conductive lines 304 are physically connected to the conductive lines 310 respectively. The patterned dielectric layers 301a are respectively interposed between the conductive lines 304 and between the conductive lines 310. In some embodiments, as shown in FIG. 6B, the conductive lines 304 and the patterned dielectric layers 301a are stacked along the third direction D3 (e.g., Z direction). Similarly, the conductive lines 310 and the patterned dielectric layers 301a are stacked along the third direction D3 (e.g., Z direction). The conductive lines 304, 310 may be also referred to as conductive layers or conductive patterns.

Figure 5C:
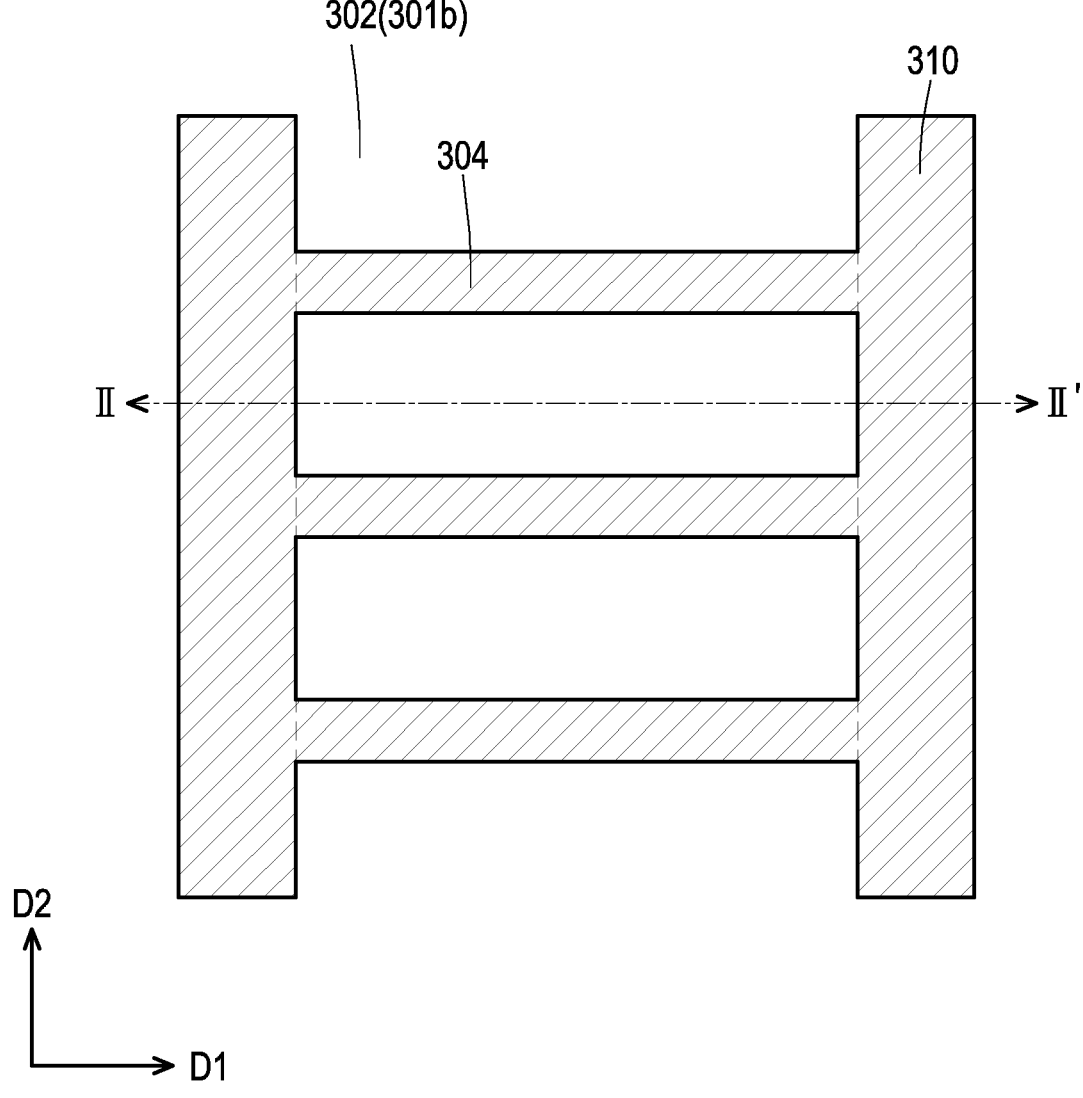
Figure 6C:
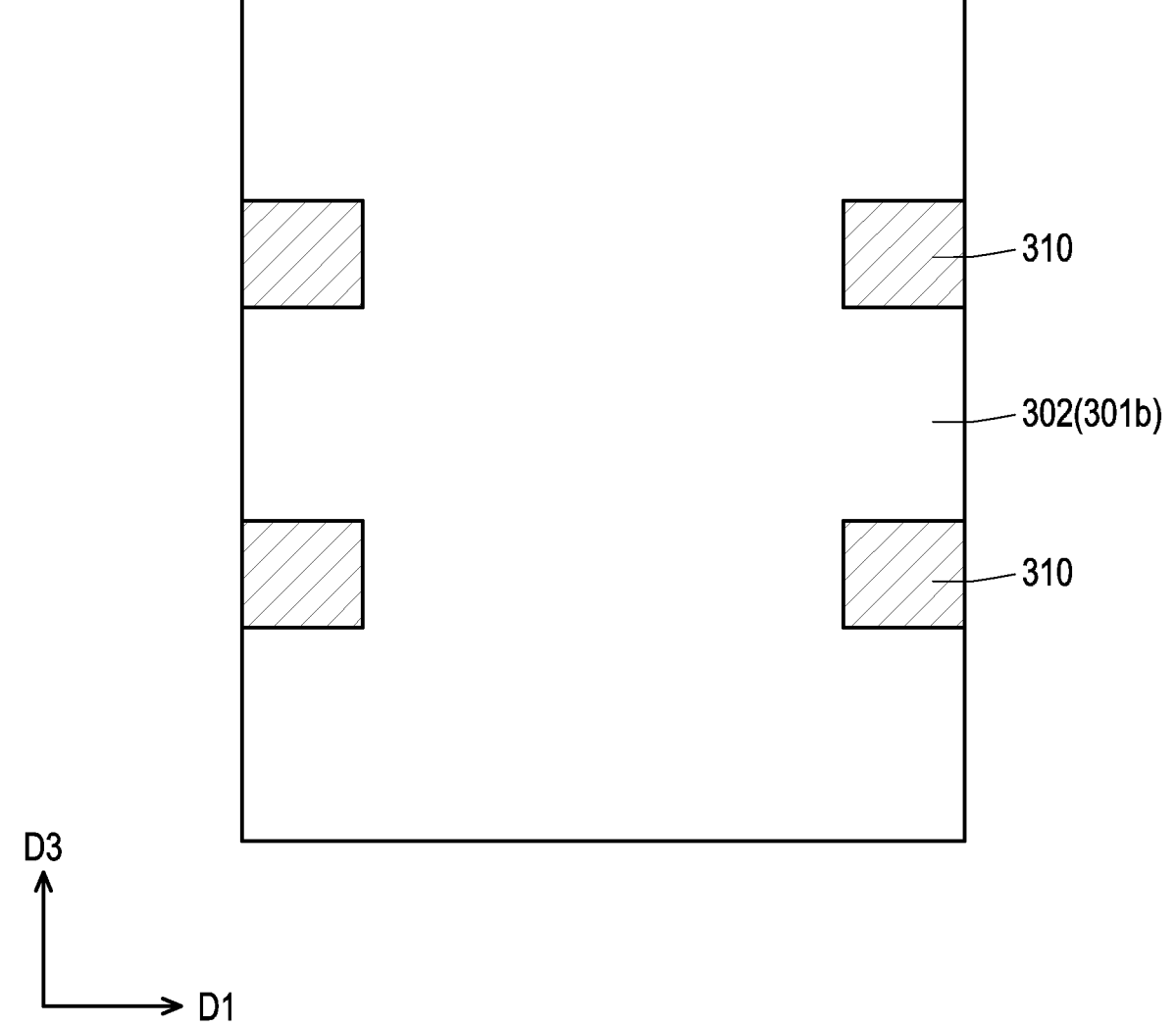

Referring to FIG. 5C and FIG. 6C, a dielectric layer 301b is formed to fill up gaps between the conductive lines 304, 310 and the patterned dielectric layers 301a. After refilling, the dielectric layer 301b and the patterned dielectric layers 301a are collectively referred to as a dielectric layer 302. The material of the dielectric layer 301b may be the same as or different from the material of the patterned dielectric layers 301a. Thus, an interface may or may not exist between the dielectric layer 301b and the patterned dielectric layers 301a. In some embodiments, the conductive lines 304, 310 are disposed in the dielectric layer 302.

Figure 5D:
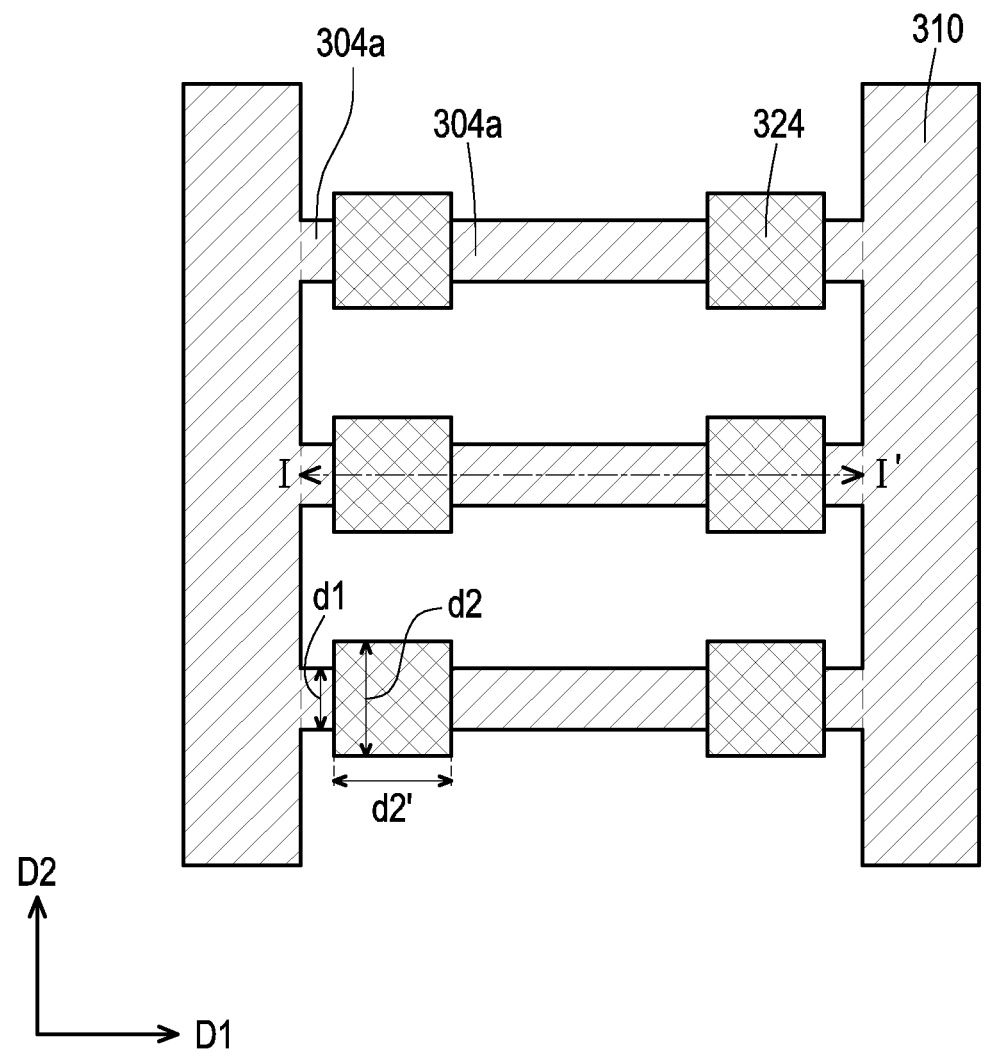
Figure 6D:
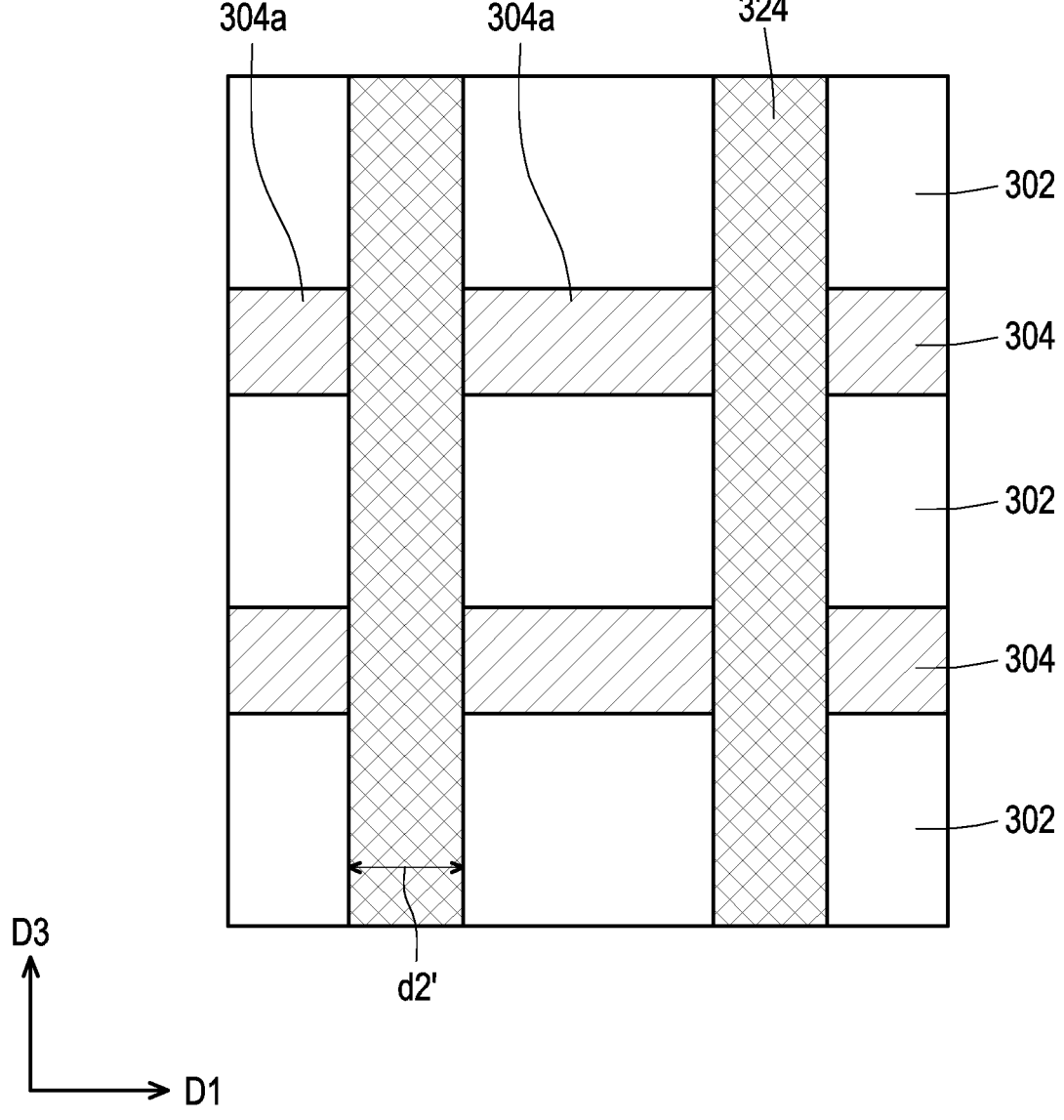

Referring to FIG. 5D and FIG. 6D, a plurality of selector pillars 324 are formed in the dielectric layer 302, to divide the conductive lines 304 into a plurality of conductive patterns 304a. In some embodiments, as shown in FIG. 6D, the selector pillar 324 extends along the third direction D3 and penetrates through the conductive lines 304 and the dielectric layer 302. The conductive lines 304 are divided into a plurality of conductive patterns 304a separated by the selector pillars 324. The selector pillars 324 may be arranged along the first direction D1 and the second direction D2. The selector pillars 324 may be formed by forming a plurality of openings in the conductive lines 304 and the dielectric layer 302, depositing a selector material in the openings and over the conductive lines 304 and the dielectric layer 302, and removing the selector material outside the openings. The material and deposition method of the selector pillars 324 are similar to those of the selector layers 224, and thus the details are not repeated herein. From a top view, as shown in FIG. 5D, the selector pillar 324 has a dimension d2 along the second direction D2 and a dimension d2' along the first direction D1. The dimension d2 of the selector pillar 324 is larger than a dimension d1 of the conductive line 304 along the second direction D2. In some embodiments, the selector pillars 324 are also referred to as selector layers or selector patterns.

Figure 5E:
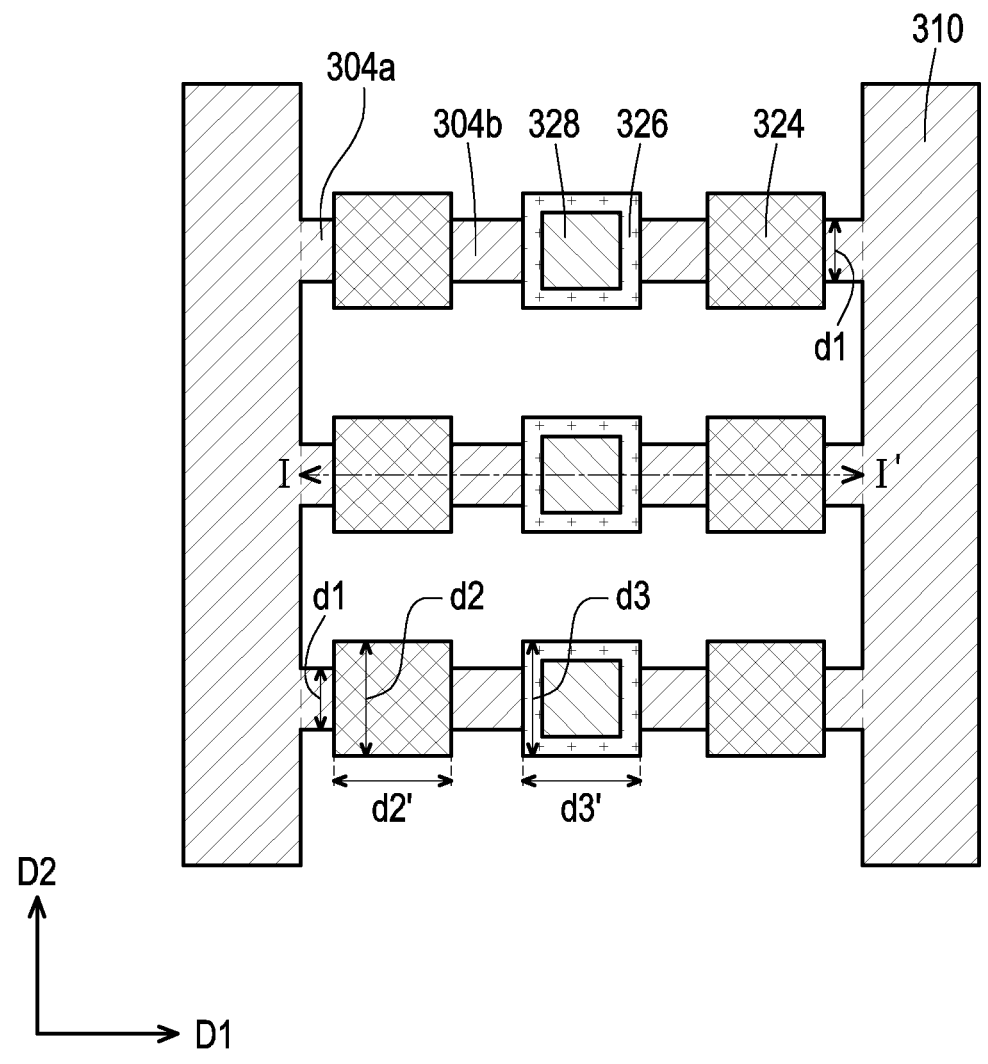
Figure 6E:
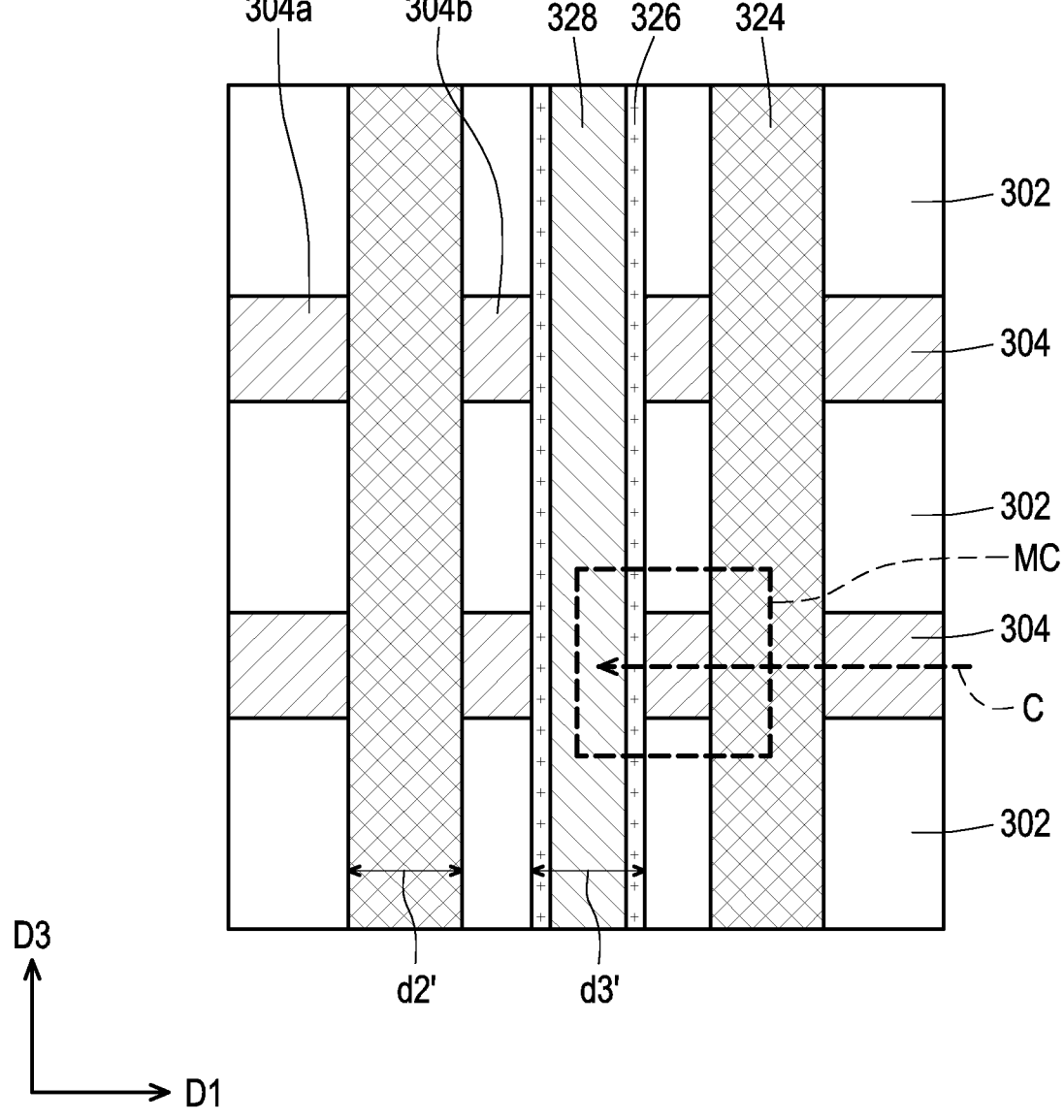

Referring to FIG. 5E and FIG. 6E, a plurality of conductive lines 328 with memory layers 326 are formed in the dielectric layer 302, to divide the conductive patterns 304a into a plurality of conductive patterns 304b. As shown in FIG. 6E, the conductive line 328 and the memory layer 326 extend along the third direction D3 and penetrate through the conductive patterns 304a and the dielectric layer 302, respectively, and the memory layer 326 surrounds the conductive line 328. Accordingly, the conductive patterns 304a between the selector pillars 324 are respectively divided into a plurality of conductive patterns 304b. In some embodiments, the conductive pattern 304b is disposed between the selector pillar 324 and the conductive line 328, and the conductive pattern 304a is disposed between the selector pillar 324 and the conductive line 310. The conductive lines 328 may be arranged along the second direction D2 between the selector pillars 324. For example, the selector pillars 324 are disposed at opposite sides of the conductive line 328, and the selector pillars 324 are disposed at opposite sides of the memory layer 326. From a top view, as shown in FIG. 5E, the conductive line 328 with the memory layer 326 have a total dimension d3 along the second direction D2 and a dimension d3' along the first direction D1, and the dimension d3 is larger than the dimension d1 of the conductive patterns 304a, 304b. The dimension d3 of the conductive line 328 with the memory layer 326 is, for example, substantially equal to the dimension d2 of the selector pillar 324 along the second direction D2. However, the disclosure is not limited thereto. The dimension d3 of the conductive line 328 with the memory layer 326 may be different from (i.e., larger than or smaller than) the dimension d2 of the selector pillar 324. Similarly, the dimension d3' of the conductive line 328 with the memory layer 326 may be substantially the same as or different from (i.e., larger than or smaller than) the dimension d2' of the selector pillar 324 along the first direction D1. In some embodiments, top surfaces of the selector pillars 324 and the conductive lines 328 are substantially coplanar with a top surface of the dielectric layer 302. In some embodiments, the conductive lines 304 of FIG. 6B are cut-off by the selector pillars 324 and the conductive lines 328, to form the conductive patterns 304a, 404b respectively between the selector pillar 324 and the conductive line 328 and between the conductive line 328 and the conductive lines 310. The conductive patterns 304a, 404b may be also referred to inter-metals, conductive lines or conductive layers. The conductive lines 328 may be also referred to as conductive pillars, conductive patterns or conductive layers.

Figure 7:
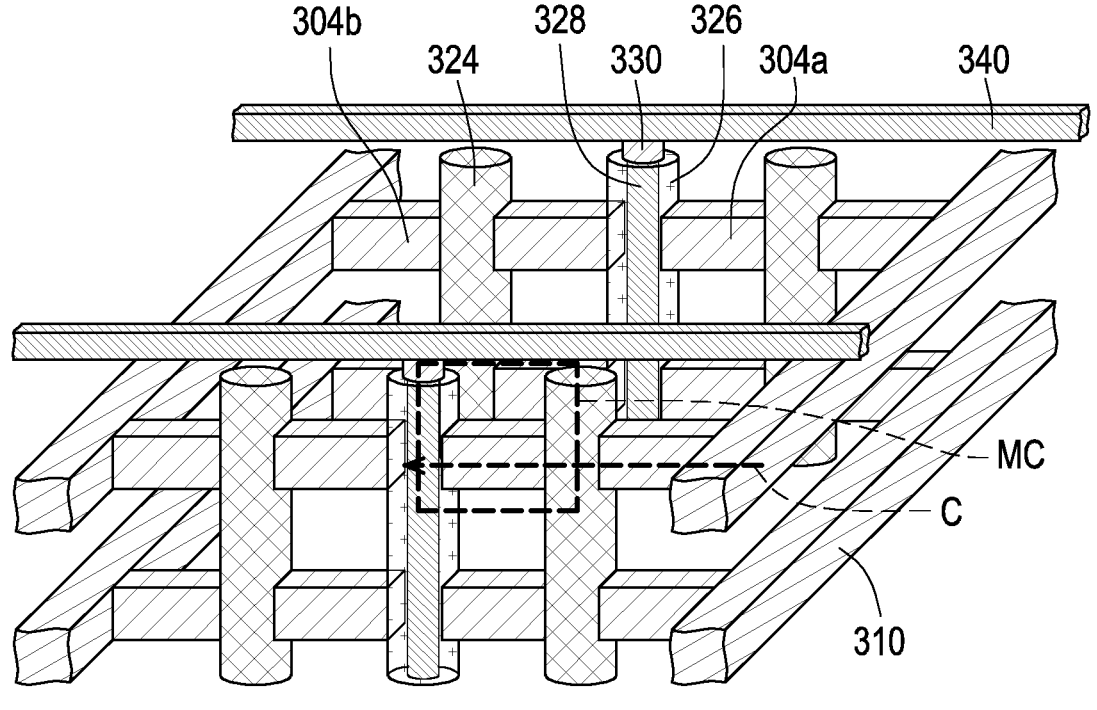
Figure 7:
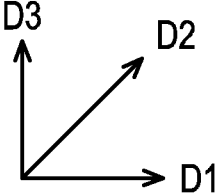

Referring to FIG. 7, a plurality of conductive lines 340 are formed to electrically connect to the conductive lines 328. For example, the conductive lines 340 are formed over the conductive lines 328, and the conductive lines 340 are electrically connected to the conductive lines 328 through contacts 330 therebetween. The conductive lines 340 extend along the first direction D1, and the conductive lines 340 cross over the conductive lines 310 therebelow, for example. In some embodiments, the conductive line 340 corresponds to and is electrically connected to a word line in the memory array while the conductive line 310 corresponds to and is electrically connected to a bit line. As shown in FIG. 6E and FIG. 7, In some embodiments, the memory cell MC is operably coupled to the word line, the source line (not shown) and the bit line. In some embodiments, the memory cell MC may have a one-selector-one resistor (1S1R) configuration. In other words, there are a selector and a resistor connected in series in each memory cell MC. In some embodiments, the current C from the conductive line 310 passes to the memory cell MC through the conductive pattern 304a, the selector layer 324, the conductive pattern 304*b*, and the memory layer 326 sequentially. The 1S1R configuration may be applied to, for example, RRAM devices.

FIG. 8 illustrates a method of forming a semiconductor device in accordance with some embodiments of the present disclosure. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S100, a stack is formed, and the stack includes a plurality of first dielectric layer, a plurality of first conductive layers and a plurality of second dielectric layers alternately arranged. FIG. 3A and FIG. 4A illustrate views corresponding to some embodiments of act S100.

At act S102, a first opening is formed in the stack to penetrate through the first dielectric layers, the first conductive layers and the second dielectric layers. FIG. 3A and FIG. 4A illustrate views corresponding to some embodiments of act S102.

At act S104, inner sidewalls of the first conductive layers are recessed through the first opening, to form a plurality of first recesses. FIG. 3A and FIG. 4A illustrate views corresponding to some embodiments of act S104.

At act S106, second conductive layers are filled in the first recesses. FIG. 3B and FIG. 3E illustrates a view corresponding to some embodiments of act S106.

At act S108, inner sidewalls of the second dielectric layers are recessed through the first opening, to form a plurality of second recesses. FIG. 3C, FIG. 3D, FIG. 4B and FIG. 4C illustrate views corresponding to some embodiments of act S108.

At act S110, selector layers are formed in the second recesses. FIG. 3E and FIG. 4D illustrate views corresponding to some embodiments of act S108.

At act S112, a memory layer is formed on sidewalls of the first opening. FIG. 3F illustrates a view corresponding to some embodiments of act S108.

At act S114, the first opening is filled with a conductive layer. FIG. 3F illustrates a view corresponding to some embodiments of act S108.

In accordance with some embodiments of the disclosure, a semiconductor device includes a first conductive layer, a memory layer, a second conductive layer and a selector layer. The memory layer surrounds the first conductive layer. The second conductive layer is disposed aside the memory layer. The selector layer is disposed on the second conductive layer. A first side of the second conductive layer is covered by the memory layer, a second side of the second conductive layer is covered by the selector layer, and a third side of the second conductive layer is exposed by the selector layer.

In accordance with some embodiments of the disclosure, a semiconductor device includes a first conductive line, a second conductive line, a third conductive line, a memory layer and a first selector pillar. The first conductive line extends along a first direction. The second conductive line extends along a second direction substantially perpendicular to the first direction. The third conductive line extends along a third direction substantially perpendicular to the first direction and the second direction, and is electrically connected to the first conductive line. The memory layer surrounds the third conductive line. The first selector pillar extends along the third direction and is disposed between the memory layer and the second conductive line.

In accordance with some embodiments of the disclosure, a method of forming a semiconductor device is as follows. A stack is formed, and the stack includes a plurality of first dielectric layer, a plurality of first conductive layers and a plurality of second dielectric layers alternately arranged. A first opening is formed in the stack to penetrate through the first dielectric layers, the first conductive layers and the second dielectric layers. Inner sidewalls of the first conductive layers are recessed through the first opening, to form a plurality of first recesses. Second conductive layers are filled in the first recesses. Inner sidewalls of the second dielectric layers are recessed through the first opening, to form a plurality of second recesses. Selector layers are formed in the second recesses.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first conductive layer;
a memory layer surrounding the first conductive layer;
a second conductive layer aside the memory layer; and
a selector layer on the second conductive layer, wherein
a first side of the second conductive layer is covered by the memory layer, a second side of the second conductive layer is covered by the selector layer, and a third side of the second conductive layer is exposed by the selector layer.

2. The semiconductor device of claim 1, wherein the third side is disposed opposite to the first side.

3. The semiconductor device of claim 1, wherein the third side is disposed opposite to the second side.

4. The semiconductor device of claim 1, wherein the first side of the second conductive layer is in direct contact with the memory layer.

5. The semiconductor device of claim 1, wherein the third side of the second conductive layer is in direct contact with a dielectric layer.

6. The semiconductor device of claim 1, wherein the selector layer is continuously disposed on the second side and a fourth side of the second conductive layer.

7. The semiconductor device of claim 1, wherein the second conductive layer further comprises a fourth side, and the fourth side is in direct contact with a dielectric layer.

8. The semiconductor device of claim 1, wherein a distance from a sidewall of the memory layer to an outer sidewall of the selector layer is larger than a distance from the sidewall of the memory layer to an outer sidewall of the second conductive layer.

9. The semiconductor device of claim 1, wherein a sidewall of the selector layer and the second conductive layer are substantially flush.

US 12,654,979 B2

17

10. A semiconductor device, comprising:
a first conductive line extending along a first direction;
a second conductive line extending along a second direction substantially perpendicular to the first direction;
a third conductive line extending along a third direction substantially perpendicular to the first direction and the second direction, and electrically connected to the first conductive line;
a memory layer surrounding the third conductive line; and
a first selector pillar extending along the third direction and disposed between the memory layer and the second conductive line.

11. The semiconductor device of claim 10, further comprising a conductive pattern disposed between and physically connected to the memory layer and the first selector pillar.

12. The semiconductor device of claim 11, wherein the conductive pattern extends along the first direction.

13. The semiconductor device of claim 10, further comprising a conductive pattern disposed between and physically connected to the first selector pillar and the second conductive line.

14. The semiconductor device of claim 10, further comprising a second selector pillar, wherein the first selector pillar and the second selector pillar are disposed at opposite sides of the third conductive line.

15. The semiconductor device of claim 10, wherein a top surface of the third conductive line, the memory layer and the first selector pillar are substantially coplanar.

16. A method of forming a semiconductor device, comprising:
forming a stack comprising a plurality of first dielectric layer, a plurality of first conductive layers and a plurality of second dielectric layers alternately arranged;
forming a first opening in the stack to penetrate through the first dielectric layers, the first conductive layers and the second dielectric layers;
recessing inner sidewalls of the first conductive layers through the first opening, to form a plurality of first recesses;
filling second conductive layers in the first recesses;
recessing inner sidewalls of the second dielectric layers through the first opening, to form a plurality of second recesses;
forming selector layers in the second recesses;
forming a memory layer on sidewalls of the first opening; and
filling the first opening with a conductive layer.

17. The method of claim 16, wherein inner sidewalls of the second conductive layers are substantially flush with inner sidewalls of the selector layers.

18. The method of claim 16, before forming the selector layers, further comprising forming third recesses by removing the first conductive layers exposed by the second recesses.

19. The method of claim 18, wherein the selector layers further forming in the third recesses.

20. The method of claim 18, wherein inner sidewalls of the first conductive layers are substantially flush with inner sidewalls of the second dielectric layers after forming the third recesses.

* * * * *